United States Patent
Muro et al.

(10) Patent No.: US 10,435,794 B2
(45) Date of Patent: Oct. 8, 2019

(54) ETCHING METHOD, ETCHING SOLUTION USED IN SAME, AND PRODUCTION METHOD FOR SEMICONDUCTOR SUBSTRATE PRODUCT

(71) Applicant: FUJIFILM Corporation, Tokyo (JP)

(72) Inventors: Naotsugu Muro, Shizuoka (JP); Tetsuya Kamimura, Shizuoka (JP); Satomi Takahashi, Shizuoka (JP); Akiko Koyama, Shizuoka (JP); Atsushi Mizutani, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 53 days.

(21) Appl. No.: 14/927,697

(22) Filed: Oct. 30, 2015

(65) Prior Publication Data
US 2016/0053385 A1  Feb. 25, 2016

Related U.S. Application Data

(63) Continuation of application No. PCT/JP2014/062068, filed on May 1, 2014.

(30) Foreign Application Priority Data

May 2, 2013 (JP) .................... 2013-097157

(51) Int. Cl.
*C23F 1/30* (2006.01)
*H01L 21/3213* (2006.01)
(Continued)

(52) U.S. Cl.
CPC ............ *C23F 1/30* (2013.01); *C23F 1/26* (2013.01); *C23F 1/28* (2013.01);
(Continued)

(58) Field of Classification Search
None
See application file for complete search history.

(56) References Cited

U.S. PATENT DOCUMENTS 6,127,279 A * 10/2000 Konuma .......... H01L 21/02071
257/E21.251
6,703,291 B1  3/2004 Boyanov et al.
(Continued)

FOREIGN PATENT DOCUMENTS

JP  9-228075 A  9/1997
JP  2006-114884 A  4/2006
(Continued)

OTHER PUBLICATIONS

Communication dated Aug. 30, 2016, issued by the Japan Patent Office in corresponding Japanese Application No. 2014-094838.
(Continued)

*Primary Examiner* — Su C Kim
(74) *Attorney, Agent, or Firm* — Sughrue Mion, PLLC

(57) ABSTRACT

There is provided an etching method of a semiconductor substrate that includes a first layer containing germanium (Ge) and a second layer containing at least one specific metal element selected from nickel platinum (NiPt), titanium (Ti), nickel (Ni), and cobalt (Co), the method including: bringing an etching solution which contains a non-halogen acidic compound into contact with the second layer and selectively removing the second layer.

26 Claims, 4 Drawing Sheets

(51) Int. Cl.
*C23F 1/28* (2006.01)
*C23F 1/26* (2006.01)
*H01L 29/66* (2006.01)
*H01L 29/417* (2006.01)
*H01L 29/78* (2006.01)

(52) U.S. Cl.
CPC .. *H01L 21/32134* (2013.01); *H01L 29/41725* (2013.01); *H01L 29/665* (2013.01); *H01L 29/7833* (2013.01)

(56) References Cited

U.S. PATENT DOCUMENTS

| | | | |
|---|---|---|---|
| 2005/0026428 A1* | 2/2005 | Choi | H01L 21/28518 438/682 |
| 2005/0250301 A1* | 11/2005 | Cabral, Jr. | H01L 21/28052 438/606 |
| 2005/0280095 A1* | 12/2005 | Nabatame | H01L 21/28097 257/369 |
| 2006/0261042 A1 | 11/2006 | Delattre | |
| 2007/0023849 A1 | 2/2007 | Yu et al. | |
| 2008/0261847 A1 | 10/2008 | Visintin et al. | |
| 2009/0050965 A1 | 2/2009 | Okamoto | |
| 2009/0085167 A1 | 4/2009 | Brunco et al. | |
| 2010/0013029 A1* | 1/2010 | Chuang | H01L 21/28518 257/412 |
| 2010/0112728 A1 | 5/2010 | Korzenski et al. | |
| 2010/0116784 A1* | 5/2010 | Archer | H01L 21/30612 216/40 |
| 2012/0156873 A1* | 6/2012 | Luo | H01L 29/41775 438/660 |
| 2013/0249010 A1* | 9/2013 | Ng | H01L 21/823842 257/369 |
| 2013/0334693 A1* | 12/2013 | Alptekin | H01L 21/28518 257/769 |

FOREIGN PATENT DOCUMENTS

| | | |
|---|---|---|
| JP | 2007-27725 A | 2/2007 |
| JP | 2008-541468 A | 11/2008 |
| JP | 2009-60110 A | 3/2009 |
| JP | 2009-515055 A | 4/2009 |
| JP | 2012-504871 A | 2/2012 |
| JP | 2012-142503 A | 7/2012 |
| JP | 2012-253374 A | 12/2012 |
| WO | 2012/125401 A1 | 9/2012 |

OTHER PUBLICATIONS

International Search Report for PCT/JP2014/062068 dated Aug. 5, 2014.

Communication dated Sep. 27, 2017 from the Taiwanese Intellectual Property Office in counterpart application No. 103115800.

* cited by examiner

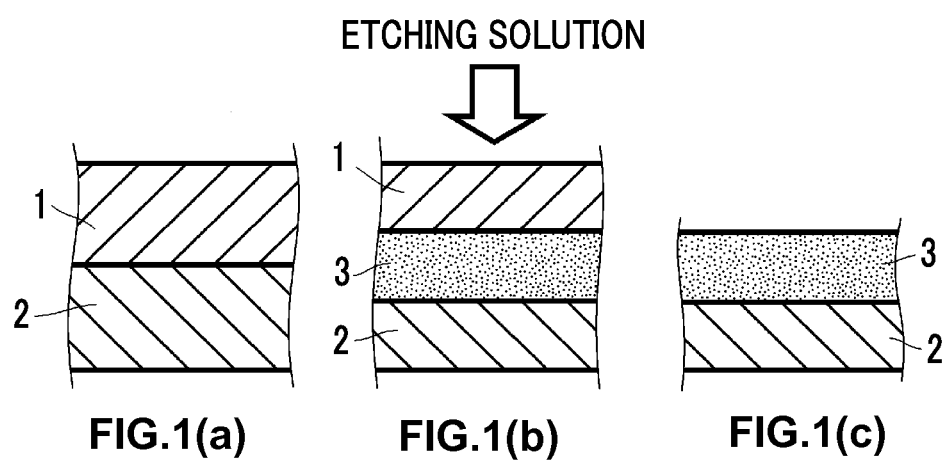

ETCHING METHOD, ETCHING SOLUTION USED IN SAME, AND PRODUCTION METHOD FOR SEMICONDUCTOR SUBSTRATE PRODUCT

CROSS-REFERENCE TO RELATED APPLICATIONS

This application is a Continuation of PCT International Application No. PCT/JP2014/062068 filed on May 1, 2014, which claims priority under 35 U.S.C. § 119 (a) to Japanese Patent Application No. 2013-097157 filed in Japan on May 2, 2013. Each of the above applications is hereby expressly incorporated by reference, in its entirety, into the present application.

BACKGROUND OF THE INVENTION

1. Field of the Invention

The present invention relates to an etching method, an etching solution used in the same, and a production method for a semiconductor substrate product.

2. Description of the Related Art

An integrated circuit is manufactured in multi-stages of various processing processes. Specifically, in the manufacturing process, deposition of various materials, lithography of a layer whose necessary portion or entire portion is exposed, or etching of the layer is repeated several times. Among these, the etching of a layer of a metal or a metal compound becomes to be an important process. A metal or the like is selectively etched and other layers are required to remain without corroding. In some cases, it is necessary that only a predetermined layer be removed in the form in which layers formed of similar metals and a layer with high corrosivity remain. A wiring in a semiconductor substrate or the size of an integrated circuit becomes smaller and thus the importance of accurately performing etching on a member to remain without corroding has been increasing.

When an example of a field effect transistor is considered, thinning of a silicide layer to be formed on the upper surface of a source and drain region and development of a new material have been strongly demanded along with rapid miniaturization of the field effect transistor. In a salicide process (salicide: self-aligned silicide) of forming the silicide layer, a part of a source region and a drain region formed of silicon and the like formed on a semiconductor substrate and a metal layer attached to the upper surface thereof are annealed. As a metal layer, tungsten (W), titanium (Ti), or cobalt (Co) is used, and more recently nickel (Ni) is being used. In this manner, a silicide layer with low resistance can be formed on the upper side of a source and drain electrode or the like. Currently, in response to further miniaturization, formation of a NiPt silicide layer to which platinum (Pt) which is a noble metal is added has been suggested.

After the salicide process is performed, the metal layer remaining in the region is removed by etching. The etching is normally performed through wet etching and a mixed solution (aqua regia) of hydrochloric acid and nitric acid is used as a liquid chemical. WO2012/125401A discloses an example of using a liquid chemical to which toluenesulfonic acid is added in addition to nitric acid and hydrochloric acid.

SUMMARY OF THE INVENTION

An object of the present invention is to provide an etching method which is capable of selectively removing a layer containing a specific metal with respect to a layer containing germanium, an etching solution used in the same, and a production method for a semiconductor substrate product.

Acidic aqua regia is used for this kind of etching solution disclosed in WO2012/125401A described above. However, in view of diversification of an etching process and expression of effects different from those of the related art, the present inventors examined an application of an etching solution which does not contain halogen. As a result, it is confirmed that the etching solution shows low etching properties (damage preventing properties) with respect to a layer containing germanium as shown in Examples below, a metal layer such as titanium is suitably removed, and excellent in-plane uniformity can be realized. The present invention is completed based on such knowledge.

The above-described problems are solved by the following means.

[1] An etching method of a semiconductor substrate includes a first layer containing germanium (Ge) and a second layer containing at least one specific metal element selected from nickel platinum (NiPt), titanium (Ti), nickel (Ni), and cobalt (Co), the method including: bringing an etching solution which contains a non-halogen acidic compound into contact with the second layer and selectively removing the second layer.

[2] The etching method according to [1], in which the concentration of germanium (Ge) of the first layer is 40% by mass or greater.

[3] The etching method according to [1] or [2], in which the acidic compound is an inorganic acid which does not contain halogen or an organic acid which contains a sulfonic acid group, a carboxyl group, a phosphoric acid group, a phosphonic acid group, or a hydroxamic acid group.

[4] The etching method according to any one of [1] to [3], in which the content of the acidic compound is in the range of 0.1% by mass to 90% by mass.

[5] The etching method according to any one of [1] to [4], further including: applying a heat treatment to at least one of the first layer and the second layer before or after etching with the etching solution.

[6] The etching method according to any one of [1] to [5], in which the second layer is selectively removed with respect to the first layer and/or the following third layer.

Third layer: layer containing germanium (Ge) and the specific metal element, which is interposed between the first layer and the second layer

[7] The etching method according to any one of [1] to [6], further including: allowing the semiconductor substrate to rotate and supplying the etching solution through a nozzle from the upper surface of the semiconductor substrate during rotation when the etching solution is provided for the semiconductor substrate.

[8] The etching method according to [7], further including: providing the etching solution while the nozzle relatively moves with respect to the rotation of the semiconductor substrate.

[9] The etching method according to any one of [1] to [8], in which the temperature of the etching solution at the time of being brought into contact with the second layer is in the range of 15° C. to 80° C.

[10] The etching method according to any one of [1] to [9], in which the time required for etching one substrate is in the range of 10 seconds to 180 seconds.

[11] The etching method according to any one of [1] to [10], further including: a step of washing the semiconductor substrate with water at least before or after the etching.

[12] The etching method according to any one of [1] to [11], in which the etching solution further contains an oxidant, and a first liquid which does not contain the oxidant and a second liquid which contains the oxidant are separated from each other and then stored.

[13] The etching method according to [12], in which the first liquid and the second liquid are mixed with each other at a suitable time when the semiconductor substrate is etched.

[14] The etching method according to any one of [1] to [13], in which the etching solution further contains the following organic additive.

Organic additive: an additive formed of an organic compound which contains a nitrogen atom, a sulfur atom, a phosphorous atom, or an oxygen atom

[15] An etching solution of a semiconductor substrate having a first layer containing germanium (Ge) and a second layer containing a specific metal element other than germanium (Ge), etching solution selectively removing the second layer and including a non-halogen acidic compound.

[16] The etching solution according to [15], in which the concentration of germanium (Ge) of the first layer is 40% by mass or greater.

[17] The etching solution according to [15] or [16], in which the specific metal element constituting the second layer is selected from nickel platinum (NiPt), titanium (Ti), nickel (Ni), and cobalt (Co).

[18] The etching solution according to any one of [15] to [17], in which the acidic compound is an inorganic acid which does not contain halogen or an organic acid which contains a sulfonic acid group, a carboxyl group, a phosphoric acid group, a phosphonic acid group, or a hydroxamic acid group.

[19] The etching solution according to any one of [15] to [18], in which the content of the acidic compound is in the range of 0.1% by mass to 90% by mass.

[20] The etching solution according to any one of [15] to [19], further containing the following organic additive.

Organic additive: an additive formed of an organic compound which contains a nitrogen atom, a sulfur atom, a phosphorous atom, or an oxygen atom

[21] A production method for a semiconductor substrate product that includes a first layer containing germanium (Ge), including: a step of forming at least the first layer and at least one kind of second layer selected from nickel platinum (NiPt), titanium (Ti), nickel (Ni), and cobalt (Co) on the semiconductor substrate; a step of forming a third layer containing components of the first layer and the second layer between both layers by heating the semiconductor substrate; a step of preparing an etching solution containing an acidic compound; and a step of bringing the etching solution into contact with the second layer and selectively removing the second layer with respect to the first layer and the third layer.

According to the etching method, the etching solution used in the same, and the production method for a semiconductor substrate product of the present invention, a layer containing a specific metal can be selectively removed with respect to a layer containing germanium and excellent in-plane uniformity can be realized.

The above-described features, other features, and advantages of the present invention will become more apparent from the following description and the accompanying drawings.

BRIEF DESCRIPTION OF THE DRAWINGS

FIG. 1(a), FIG. 1(b) and FIG. 1(c) each are a sectional view schematically illustrating examples of a process of preparing a semiconductor substrate according to an embodiment of the present invention.

DESCRIPTION OF THE PREFERRED EMBODIMENTS

Figure 2A:
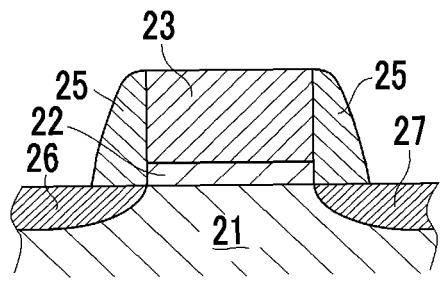
FIG. 2(A), FIG. 2(B), FIG. 2(C), FIG. 2(D) and FIG. 2(E) each are a process view illustrating examples of manufacturing a MOS transistor according to an embodiment of the present invention.

First, preferred embodiments of an etching process according to an etching method of the present invention will be described with reference to FIGS. 1(a) to 1(c) and 2(A) to 2(E).

[Etching Process]

FIG. 1(a), FIG. 1(b) and FIG. 1(c) each are a view illustrating a semiconductor substrate before and after etching is performed. In preparation examples of the present embodiment, a metal layer (second layer) 1 is arranged on the upper surface of a silicon layer (first layer) 2. As the silicon layer (first layer), a SiGe epitaxial layer constituting a source electrode or a drain electrode is used. In the present invention, it is preferable that the silicon layer is a SiGe epitaxial layer or a Ge epitaxial layer in terms such that remarkable effects of the etching solution are exhibited.

As a constituent material of the metal layer (second layer) 1, titanium (Ti), cobalt (Co), nickel (Ni), or nickel platinum (NiPt) is exemplified. In order to form a metal layer, a method normally used for forming such a metal layer can be used. Specifically, a film formation method using chemical vapor deposition (CVD) is exemplified. In this case, the thickness of the metal layer is not particularly limited, but a film whose thickness is in the range of 5 nm to 50 nm is exemplified. In the present invention, it is preferable that a metal layer is a NiPt layer (the content of Pt is preferably in the range of more than 0% by mass to 20% by mass) or a Ni layer (the content of Pt is 0% by mass) in terms such that remarkable effects of the etching solution are exhibited.

The metal layer may contain other elements other than the metal elements exemplified above. For example, oxygen or nitrogen to be inevitably mixed thereinto may be present. It is preferable that the amount of inevitable impurities is suppressed within the range of 1 ppt to 10 ppm. From such a viewpoint, it is preferable that the second layer (metal layer) is a layer substantially formed of metal elements.

Further, materials which are not desired to be etched are present on the semiconductor substrate in addition to the materials described above. It is possible for the etching solution of the present invention to minimize corrosion of the materials which are not desired to be etched. As the materials which are not desired to be etched, at least one selected from a group consisting of Al, $SiO_2$, SiN, SiOC, HfO, and TiAlC is exemplified.

After the metal layer 1 is formed on the upper side of the silicon layer 2 in the above-described process (a), annealing (sintering) is performed and a metal-Si reaction film (third layer: germanium silicide layer) 3 is formed on the interface thereof (process (b)). The annealing may be performed under conditions normally used for manufacturing this kind of element, and a treatment performed in a temperature range of 200° C. to 1000° C. is exemplified. In this case, the thickness of the germanium silicide layer 3 is not particularly limited, but a layer whose thickness is 50 nm or less or a layer whose thickness is 10 nm or less is exemplified. The lower limit is not particularly limited, but the lower limit is substantially 1 nm or greater. The germanium silicide layer is used as a low resistance film and functions as a conductive portion that electrically connects a source electrode, a drain electrode positioned in the lower portion thereof and a wiring arranged in the upper portion thereof. Accordingly, conduction is inhibited when defects or corrosion occurs in the germanium silicide layer and this leads to degradation in quality such as malfunction of an element in some cases. Particularly, the structure of an integrated circuit in the inside of a substrate has been miniaturized and thus even a small amount of damage may have a great impact on the performance of the element. Consequently, it is desired to prevent such defects or corrosion as much as possible.

Moreover, in the present specification, the germanium silicide layer is included in the germanium-containing layer of the first layer in a broad sense. Therefore, selective removal of the second layer with respect to the first layer includes an aspect of preferentially removing the second layer (metal layer) with respect to the germanium-containing layer which is not silicided and an aspect of preferentially removing the second layer (metal layer) with respect to the germanium silicide layer. In a narrow sense, when it is necessary to distinguish the germanium-containing layer (excluding the germanium silicide layer) of the first layer from the germanium silicide layer of the third layer, the layers are respectively referred to as the first layer and the third layer.

Next, the remaining metal layer 1 is etched (process (b)→process (c)). In the present embodiment, the etching solution is used at this time and the metal layer 1 is removed by providing the etching solution from the upper side of the metal layer 1 to be in contact with the metal layer 1. The provision of the etching solution will be described below.

The silicon layer 2 is formed of a SiGe epitaxial layer and can be formed through crystal-growth on a silicon substrate having a specific crystallinity according to a chemical vapor deposition (CVD) method. Alternatively, an epitaxial layer formed from a desired crystallinity may be formed according to electron beam epitaxy (MBE).

In order to use the silicon layer as a P type layer, it is preferable that boron (B) whose concentration is in the range of $1\times10^{14}$ cm$^{-3}$ to $1\times10^{21}$ cm$^{-3}$ is doped. In order to use the germanium-containing layer as an N type layer, it is preferable that phosphorus (P) whose concentration is in the range of $1\times10^{14}$ cm$^{-3}$ to $1\times10^{21}$ cm$^{-3}$ is doped.

The Ge concentration in the SiGe epitaxial layer is preferably 20% by mass or greater and more preferably 40% by mass or greater. The upper limit thereof is preferably 100% by mass or less and more preferably 90% by mass or less. Since the in-plane uniformity of a treated wafer can be improved, it is preferable that the Ge concentration is set to be within the above-described range. The reason why it is preferable that Ge has a relatively high concentration is assumed as follows. In a case where Ge is compared with Si, it is understood that an oxide film SiOx is generated after Si is oxidized and the oxide become a reaction-stop layer without being eluted. For this reason, a difference is generated between a portion in which Ge is eluted and a portion in which the reaction is stopped due to SiOx within the wafer and thus the in-plane uniformity of the wafer is damaged. Meanwhile, it is considered that the influence of inhibition of SiOx according to the above-described mechanism becomes decreased when the Ge concentration becomes greater and thus the in-plane uniformity of the wafer can be secured when a liquid chemical with high removability with respect to the metal layer such as the etching solution of the present invention is used. In addition, in a case where the concentration of germanium is 100% by mass, a layer formed along with an alloy of the second layer resulting from the annealing contains germanium and specific metal elements of the second layer and does not contain silicon, but is referred to as a germanium silicide layer including the above-described meaning for the sake of convenience in the present specification.

The germanium silicide layer (third layer) is a layer containing germanium (Ge) and the specific metal elements interposed between the first layer and the second layer. The composition thereof is not particularly limited, but "x+y" is preferably in the range of 0.2 to 0.8 and more preferably in the range of 0.3 to 0.7 in the formula of $Si_xGe_yM_z$ (M: metal element) when "x+y+z" is set to 1. In a case of z, z is preferably in the range of 0.2 to 0.8 and more preferably in the range of 0.3 to 0.7. The preferable range of the ratio of x to y is as defined above. In this case, the third layer may contain other elements. This point is the same as that described in the section of the metal layer (second layer).

(Processing of MOS Transistor)

Figure 2B:
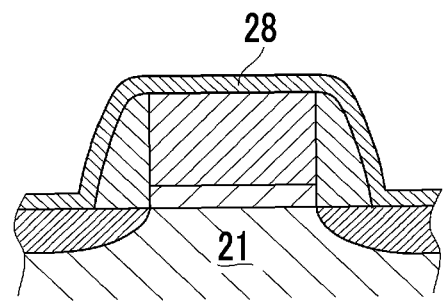
Figure 2C:
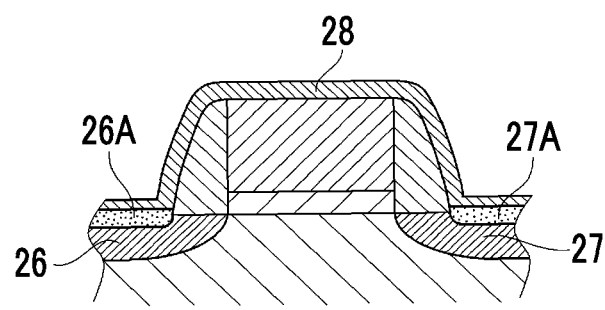
Figure 2D:
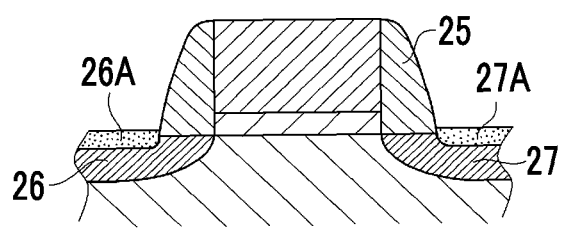
Figure 2E:
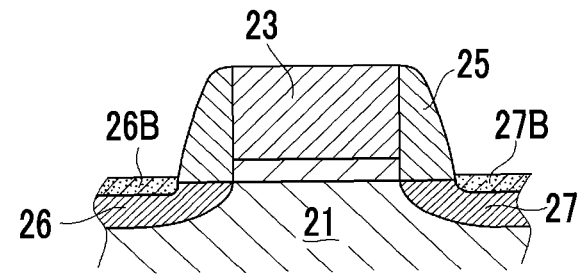

FIG. 2(A), FIG. 2(B), FIG. 2(C), FIG. 2(D) and FIG. 2(E) each are a process view illustrating examples of manufacturing a MOS transistor. FIG. 2(A) illustrates a process of forming the structure of the MOS transistor, FIG. 2(B) illustrates a process of sputtering the metal layer, FIG. 2(C) illustrates a first annealing process, FIG. 2(D) illustrates a process of selectively removing the metal layer, and FIG. 2(E) illustrates a second annealing process.

As illustrated in the figures, a gate electrode 23 is formed through a gate insulating film 22 formed on the surface of a silicon substrate 21. Extension regions may be individually formed on both sides of the gate electrode 23 of the silicon substrate 21. A protective layer (not illustrated) that prevents contact with a NiPt layer may be formed on the upper side of the gate electrode 23. Moreover, a side wall 25 formed of a silicon oxide film or a silicon nitride film is formed and a source electrode 26 and a drain electrode 27 are formed by ion implantation.

Next, as illustrated in the figures, a NiPt film 28 is formed and a rapid annealing treatment is performed. In this manner, elements in the NiPt film 28 are allowed to be diffused into the silicon substrate for silicidation (in the present specification, for the sake of convenience, an alloy resulting from annealing is referred to as silicidation including the case where the concentration of germanium is 100% by mass). As a result, the upper portion of the source electrode 26 and the drain electrode 27 is silicided and a NiPtGeSi source electrode portion 26A and a NiPtSiGe drain electrode portion 27A are formed. At this time, as illustrated in FIG. 2(E), an electrode member can be changed to be in a desired state by performing the second annealing if necessary. The temperature of the first annealing or the second annealing is not particularly limited, but the annealing can be performed in a temperature range of for example, 400° C. to 1100° C.

The NiPt film 28 remaining without contributing to silicidation can be removed using the etching solution of the present invention (FIGS. 2(C) and 2(D)). At this time, illustration is made in a greatly schematic manner and the NiPt film remaining by being deposited on the upper portion of the silicided layer (26A and 27A) may or may not be present. The semiconductor substrate or the structure of the product is illustrated in a simplified manner and, if necessary, the illustration may be interpreted such that there is a required member.

Silicon substrate 21: Si, SiGe, and Ge
Gate insulating film 22: $HfO_2$ (High-k)
Gate electrode 23: Al, W, TiN, or Ta
Side wall 25: SiOCN, SiN, $SiO_2$ (low-k)
Source electrode 26: SiGe and Ge
Drain electrode 27: SiGe and Ge
Metal layer 28: Ni, Pt and Ti
Cap (not illustrated): TiN The semiconductor substrate to which the etching method of the present invention is applied is described above, but the etching method of the present invention can be applied to other semiconductor substrates without being limited to the specific example. For example, a semiconductor substrate including a high dielectric film/metal gate FinFET which has a silicide pattern on the source region and/or the drain region is exemplified.

Figure 5:
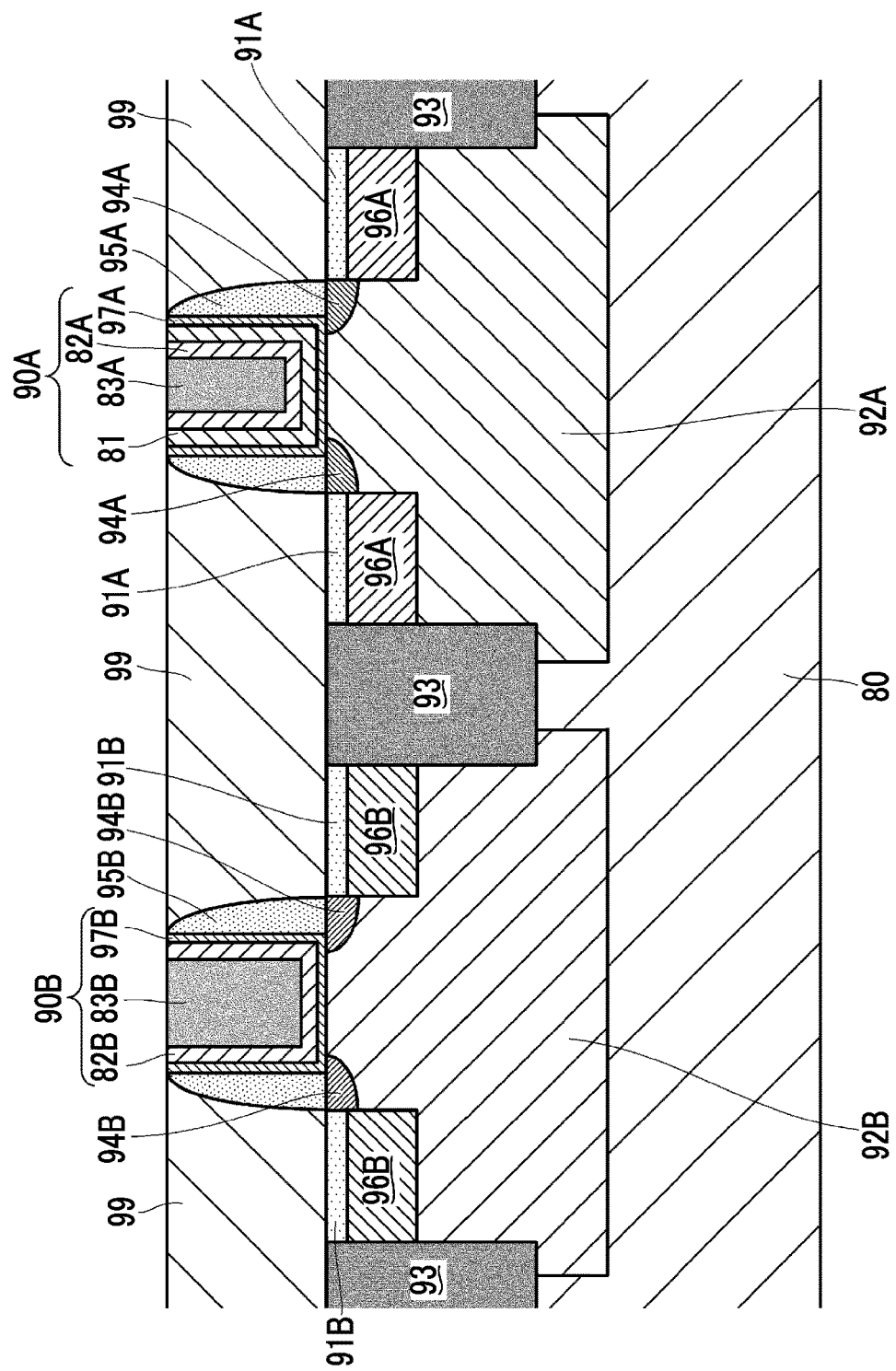
FIG. 5 is a sectional view schematically illustrating a structure of a substrate according to another embodiment of the present invention.

FIG. 5 is a sectional view schematically illustrating a structure of a substrate according to another embodiment of the present invention. The reference numeral 90A indicates a first gate stack positioned in a first device region. The reference numeral 90B indicates a second gate stack positioned in a second element region. Here, the gate stack contains a conductive tantalum alloy layer or TiAlC. When the first gate stack is described, the reference numeral 92A indicates a well. The reference numeral 94A indicates a first source/drain extension region, the reference numeral 96A indicates a first source/drain region, and the reference numeral 91A indicates a first metal semiconductor alloy portion. The reference numeral 95A indicates a first gate spacer. The reference numeral 97A indicates a first gate insulating film, the reference numeral 81 indicates a first work function material layer, and the reference numeral 82A indicates a second work function material layer. The reference numeral 83A indicates a first metal portion which becomes an electrode. The reference numeral 93 indicates a trench structure portion and the reference numeral 99 indicates a flattened dielectric layer. The reference numeral 80 indicates a lower semiconductor layer.

The first gate stack has the same structure as that of the second gate stack and the reference numerals 91B, 92B, 94B, 95B, 96B, 97B, 82B, and 83B respectively correspond to the reference numerals 91A, 92A, 94A, 95A, 96A, 97A, 82A, and 83A of the first gate stack. When a difference between both structures is described, the first gate stack includes the first work function material layer 81, but the second gate stack is not provided with such a layer.

The work function material layer may be any one of a p type work function material layer or an n type work function material layer. The p type work function material indicates a material having a work function between a valence band energy level and a mid-band gap energy level of silicon. That is, the energy level of a conduction band and the valence band energy level are equivalently separated from each other in the energy level of silicon. The n type work function material indicates a material having a work function between the energy level of the conduction band of silicon and the mid-band gap energy level of silicon.

It is preferable that the material of the work function material layer is a conductive tantalum alloy layer or TiAlC. The conductive tantalum ally layer can contain a material selected from (i) an alloy of tantalum and aluminum, (ii) an alloy of tantalum and carbon, and (iii) an alloy of tantalum, aluminum, and carbon.

(i) TaAl
In the alloy of tantalum and aluminum, the atom concentration of tantalum can be set to be in the range of 10% to 99%. The atom concentration of aluminum can be set to be in the range of 1% to 90%.

(ii) TaC
In the alloy of tantalum and carbon, the atom concentration of tantalum can be set to be in the range of 20% to 80%. The atom concentration of carbon can be set to be in the range of 20% to 80%.

(iii) TaAlC
In the alloy of tantalum, aluminum, and carbon, the atom concentration of tantalum can be set to be in the range of 15% to 80%. The atom concentration of aluminum can be set to be in the range of 1% to 60%. The atom concentration of carbon can be set to be in the range of 15% to 80%.

In another embodiment, the work function material layer can be set to be (iv) a titanium nitride layer substantively formed of titanium nitride or (v) a layer of an alloy of titanium, aluminum, and carbon.

(iv) TiN
In the titanium nitride layer, the atom concentration of titanium can be set to be in the range of 30% to 90%. The atom concentration of nitrogen can be set to be in the range of 10% to 70%.

(v) TiAlC
In the layer of the alloy of titanium, aluminum, and carbon, the atom concentration of titanium can be set to be in the range of 15% to 45%. The atom concentration of aluminum can be set to be in the range of 5% to 40%. The atom concentration of carbon can be set to be in the range of 5% to 50%.

The work function material layer can be formed by atomic layer deposition (ALD), physical vapor deposition (PVD), or chemical vapor deposition (CVD). It is preferable that the work function material layer is formed so as to cover the gate electrode, and the film thickness thereof is preferably 100 nm or less, more preferably 50 nm or less, and still more preferably in the range of 1 nm to 10 nm.

Among these, in the present invention, it is preferable to use a substrate in which a layer of TiAlC is employed from a viewpoint of suitably expressing selectivity of etching.

In the element of the present embodiment, the gate dielectric layer is formed of a high-k material containing a metal and oxygen. A known material can be used as the high-k gate dielectric material. The layer can be allowed to be deposited using a normal method. Examples thereof include chemical vapor deposition (CVD), physical vapor deposition (PVD), molecular beam deposition (MBD), pulsed laser deposition (PLD), liquid raw material mist chemical deposition (LSMCD), and atomic layer deposition (ALD). Examples of the typical high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, and $Y_2O_xN_y$. x is in the range of 0.5 to 3 and y is in the range of 0 to 2. The thickness of the gate dielectric layer is preferably in the range of 0.9 nm to 6 nm and more preferably in the range of 1 nm to 3 nm. Among these, it is preferable that the gate dielectric layer is formed of hafnium oxide ($HfO_2$).

Other members or structures can be formed by a normal method according to appropriate normal materials. Specifically, US2013/0214364A and US2013/0341631A can be referenced and the contents of which are incorporated by reference.

In the etching solution according to the preferred embodiment of the present invention, even in a case of a substrate whose work function material layer described above is exposed, metals (Ni, Pt, Ti, and the like) of the first layer can be effectively removed while suppressing damage of the layer.

[Etching Solution]

Next, a preferred embodiment of the etching solution of the present invention will be described. The etching solution of the present embodiment contains a non-halogen acidic compound and an oxidant and a specific organic additive as needed. Hereinafter, respective components including arbitrary components will be described below.

(Non-Halogen Acidic Compound)

In the present invention, a non-halogen acidic compound is used as an acidic component of the etching solution. Non-halogen means that a halogen element is not contained, for example, fluorine, chlorine, bromine, iodine, or astatine and the non-halogen acidic compound indicates an acidic compound which does not contain these halogen elements.

Examples of the inorganic acid include sulfuric acid ($H_2SO_4$), nitric acid ($HNO_3$), phosphoric acid ($H_3PO_4$), and phosphonic acid ($H_3PO_3$), other than halogen acid such as hydrochloric acid.

An organic acid compound having a sulfonic acid group, a carboxyl group, a phosphoric acid group, a phosphonic acid group, or a hydroxamic acid group is preferable as an organic acid. The number of carbon atoms of the organic acid compound is preferably in the range of 1 to 24, more preferably in the range of 1 to 16, and particularly preferably in the range of 1 to 8.

It is preferable that the organic acid is formed of a compound represented by the following Formula (O-1).

$$Ra—(Ac)n \qquad (O\text{-}1)$$

Ra represents an alkyl group having 1 to 24 carbon atoms (the number of carbon atoms is preferably in the range of 1 to 16, more preferably in the range of 1 to 12, and particularly preferably in the range of 1 to 8), an alkenyl group having 2 to 24 carbon atoms (the number of carbon atoms is preferably in the range of 2 to 16, more preferably in the range of 2 to 12, and particularly preferably in the range of 2 to 8), an alkynyl group having 2 to 24 carbon atoms (the number of carbon atoms is preferably in the range of 2 to 16, more preferably in the range of 2 to 12, and particularly preferably in the range of 2 to 8), an aryl group having 6 to 18 carbon atoms (the number of carbon atoms is preferably in the range of 6 to 14 and more preferably in the range of 6 to 10), or an aralkyl group having 7 to 19 carbon atoms (the number of carbon atoms is preferably in the range of 7 to 15 and more preferably in the range of 7 to 11). When Ra represents an alkyl group, an alkenyl group, or an alkynyl group, for example, one to six O, S, CO, or $NR^N$ (the definition of $R^N$ will be mentioned later) may be present in a range of 1 to 6. Further, Ra may further include a substituent T and examples of the arbitrary substituent include a hydroxy group, a sulfanyl group, $NR^N_2$, and a halogen atom (a fluorine atom, a chlorine atom, or a bromine atom). The number of arbitrary substituents is preferably in the range of 1 to 6 and more preferably in the range of 1 to 4.

Ac represents a sulfonic acid group, a carboxyl group, a phosphoric acid group, a phosphonic acid group, or a hydroxamic acid group. When Ac represents a carboxyl group or a hydroxamic acid group, Ra may represent a hydrogen atom.

n represents an integer of 1 to 4.

The concentration of the acidic compound contained in the etching solution is preferably 0.1% by mass or greater, more preferably 2% by mass, and particularly preferably 5% by mass or greater. The upper limit thereof is preferably 90% or less, more preferably 70% by mass or less, and particularly preferably 60% by mass or less. It is preferable that the concentration of the acidic compound is set to be in the above-described range because excellent in-plane uniformity can be obtained. In regard to identification of components of the etching solution, it is not necessary for the components thereof to be confirmed as acidic compounds. For example, in a case of nitric acid, when nitric acid ions ($NO_3^-$) in an aqueous solution are identified, the presence and the amount thereof are grasped.

Moreover, in the present invention, the acid compounds may be used alone or in combination of two or more kinds thereof. In the case where the acid compounds are used in combination of two or more kinds thereof, the combining ratio is not particularly limited, but the total amount used thereof is preferably in the above-described range of concentration as the sum of two or more kinds of acid compounds.

(Oxidant)

It is preferable that the etching solution according to the present embodiment contains an oxidant. Preferred examples of the oxidant include nitric acid and hydrogen peroxide.

The concentration of the oxidant contained in the etching solution is preferably 0.1% by mass or greater, more preferably 1% by mass or greater, and particularly preferably 2% by mass or greater. The upper limit thereof is preferably 20% by mass or less, more preferably 15% by mass or less, and particularly preferably 10% by mass or less.

It is preferable that the concentration of the oxidant is set to be in the above-described range because excellent in-plane uniformity can be obtained. In regard to identification of components of the etching solution, it is not necessary for the components thereof to be confirmed as nitric acid. For example, when nitric acid ions ($NO_3^-$) in an aqueous solution are identified, the presence and the amount thereof are grasped.

The oxidant may be used alone or in combination of two or more kinds thereof.

(Specific Organic Additive)

It is preferable that the etching solution according to the present embodiment contains a specific organic additive. The organic additive is formed of an organic compound containing a nitrogen atom, a sulfur atom, a phosphorous atom, or an oxygen atom. Among these, it is preferable that the organic additive is a compound including a substituent or a linking group selected from an amino group (—NW) or a salt thereof, an imino group (—$NR^N$—) or a salt thereof, a sulfanyl group (—SH), a hydroxy group (—OH), a carbonyl group (—CO—), a sulfonic acid group (—$SO_3H$) or a salt thereof, a phosphoric acid group (—$PO_4H_2$) or a salt thereof, an onium group or a salt thereof, a sulfinyl group (—SO—), a sulfonyl group ($SO_2$), an ether group (—O—), an amine oxide group, and a thioether group (—S—). Further, it is also preferable that the organic additive is an aprotic dissociable organic compound (an alcohol compound, an ether compound, an ester compound, or a carbonate compound), an azole compound, a betaine compound, a sulfonic acid compound, an amide compound, an onium compound, an amino acid compound, a phosphoric acid compound, or a sulfoxide compound.

$R^N$ of the amino group represents a hydrogen atom or a substituent. As the substituent, an alkyl group (the number of carbon atoms is preferably in the range of 1 to 24 and more preferably in the range of 1 to 12), an alkenyl group (the number of carbon atoms is preferably in the range of 2 to 24 and more preferably in the range of 2 to 12), an alkynyl group (the number of carbon atoms is preferably in the range of 2 to 24 and more preferably in the range of 2 to 12), an aryl group having 6 to 10 carbon atoms, or an aralkyl group having 7 to 11 carbon atoms is preferable.

It is particularly preferable that the specific organic additive is formed of a compound represented by the following Formulae (I) to (XII).

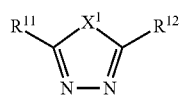
(I)

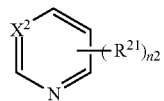
(II)

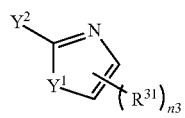
(III)

(IV)

(V)

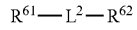
(VI)

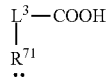
(VII)

(IIX)

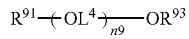
(IX)

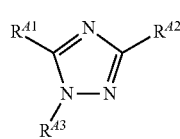
(X)

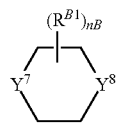
(XI)

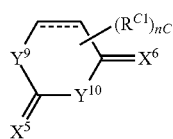
(XII)

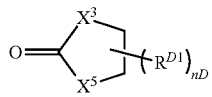
(XIII)

Formula (I): $R^{11}$ and $R^{12}$ each independently represent a hydrogen atom, an alkyl group (the number of carbon atoms is preferably in the range of 1 to 12, more preferably in the range of 1 to 6, and particularly preferably in the range of 1 to 3), an alkenyl group (the number of carbon atoms is preferably in the range of 2 to 12 and more preferably in the range of 2 to 6), an alkynyl group (the number of carbon atoms is preferably in the range of 2 to 12 and more preferably in the range of 2 to 6), an aryl group (the number of carbon atoms is preferably in the range of 6 to 22 and more preferably in the range of 6 to 14), an aralkyl group (the number of carbon atoms is preferably in the range of 7 to 23 and more preferably in the range of 7 to 15), a sulfanyl group (SH), a hydroxy group (OH), or an amino group ($-NR^N_2$). In this case, at least one of $R^{11}$ and $R^{12}$ represents a sulfanyl group, a hydroxy group, or an amino group (the number of carbon atoms is preferably in the range of 0 to 6 and more preferably in the range of 0 to 3). Further, when the above-described substituents further include other substituents (an alkyl group, an alkenyl group, and an aryl group), an arbitrary substituent T may be further included. The same applies to a substituent or a linking group described below.

$X^1$ represents a methylene group ($CR^C_2$), a sulfur atom (S), or an oxygen atom (O). $R^C$ represents a hydrogen atom or a substituent (the substituent T described below is preferable).

Formula (II): $X^2$ represents a methine group ($=CR^C-$) or a nitrogen atom (N). $R^{21}$ represents a substituent (the substituent T described below is preferable). Among these, a sulfanyl group (SH), a hydroxy group (OH), or an amino group ($NR^N_2$) is preferable.

n2 represents an integer of 0 to 4.

When a plurality of $R^{21}$'s are present, $R^{21}$'s may be the same as or different from each other and may be bonded to each other or condensed to form a ring.

Formula (III): $Y^1$ represents a methylene group, an imino group ($NR^N$), or a sulfur atom (S). $Y^2$ represents a hydrogen atom, an alkyl group (the number of carbon atoms is preferably in the range of 1 to 12, more preferably in the range of 1 to 6, and particularly preferably in the range of 1 to 3), an alkenyl group (the number of carbon atoms is preferably in the range of 2 to 12 and more preferably in the range of 2 to 6), an alkynyl group (the number of carbon atoms is preferably in the range of 2 to 12 and more preferably in the range of 2 to 6), an aryl group (the number of carbon atoms is preferably in the range of 6 to 22 and more preferably in the range of 6 to 14), an aralkyl group (the number of carbon atoms is preferably in the range of 7 to 23 and more preferably in the range of 7 to 15), an amino group (the number of carbon atoms is preferably in the range of 0 to 6 and more preferably in the range of 0 to 3), a hydroxy group, or a sulfanyl group.

$R^{31}$ represents a substituent (the substituent T described below is preferable). Among these substituents, a sulfanyl group (SH), a hydroxy group (OH), or an amino group ($NR^N_2$) is preferable.

n3 represents an integer of 0 to 2.

When a plurality of $R^{31}$'s are present, $R^{31}$'s may be the same as or different from each other and may be bonded to each other or condensed to form a ring. As the ring to be formed, a 6-membered ring is preferable and examples thereof include rings having a benzene structure or a 6-membered heteroaryl structure.

It is preferable that Formula (III) is Formula (III-1) below.

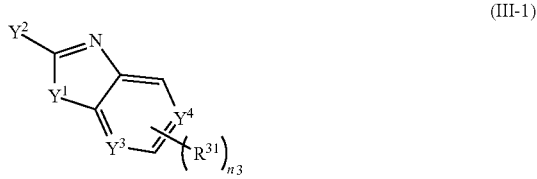

(III-1)

$Y^3$ and $Y^4$ each independently represent a methine group ($=CR^C$—) or a nitrogen atom (N).

$Y^1$, $Y^2$, $R^{31}$, and n3 have the same definitions as those described above. The positions of $Y^3$ and $Y^4$ may be different in a 6-membered ring.

$L^1$ represents an alkylene group (the number of carbon atoms is preferably in the range of 1 to 12, more preferably in the range of 1 to 6, and particularly preferably in the range of 1 to 3), an alkynylene group (the number of carbon atoms is preferably in the range of 2 to 12 and more preferably in the range of 2 to 6), an alkenylene group (the number of carbon atoms is preferably in the range of 2 to 12 and more preferably in the range of 2 to 6), an arylene group (the number of carbon atoms is preferably in the range of 6 to 22 and more preferably in the range of 6 to 14), or an aralkylene group (the number of carbon atoms is preferably in the range of 7 to 23 and more preferably in the range of 7 to 15).

$X^4$ represents a carboxyl group or a hydroxy group.

Formula (V): $R^{51}$ represents an alkyl group (the number of carbon atoms is preferably in the range of 1 to 24, more preferably in the range of 1 to 12, still more preferably in the range of 1 to 6, and particularly preferably in the range of 1 to 3), an alkenyl group (the number of carbon atoms is preferably in the range of 2 to 24, more preferably in the range of 2 to 12, and still more preferably in the range of 2 to 6), an alkynyl group (the number of carbon atoms is preferably in the range of 2 to 24, more preferably in the range of 2 to 12, and still more preferably in the range of 2 to 6), an aryl group (the number of carbon atoms is preferably in the range of 6 to 22 and more preferably in the range of 6 to 14), or an aralkyl group (the number of carbon atoms is preferably in the range of 7 to 23 and more preferably in the range of 7 to 15).

When $R^{51}$ represents an aryl group, it is preferable that an alkyl group having 1 to 20 carbon atoms, an alkenyl group having 2 to 20 carbon atoms, or an alkynyl group having 2 to 20 carbon atoms is substituted therewith.

When $R^{51}$ represents an alkyl group, the structure thereof may be as follows.

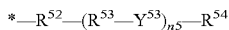

$R^{52}$ is a single bond or a linking group which has the same definition as that for $L^1$. $R^{53}$ is a linking group which has the same definition as that for $L^1$. $Y^{53}$ represents an oxygen atom (O), a sulfur atom (S), a carbonyl group (CO), or an imino group ($NR^N$). $R^{54}$ represents an alkyl group (the number of carbon atoms is preferably in the range of 1 to 12, more preferably in the range of 1 to 6, and particularly preferably in the range of 1 to 3), an alkenyl group (the number of carbon atoms is preferably in the range of 2 to 12 and more preferably in the range of 2 to 6), an alkynyl group (the number of carbon atoms is preferably in the range of 2 to 12 and more preferably in the range of 2 to 6), an aryl group (the number of carbon atoms is preferably in the range of 6 to 22 and more preferably in the range of 6 to 14), or an aralkyl group (the number of carbon atoms is preferably in the range of 7 to 23 and more preferably in the range of 7 to 15).

n5 represents an integer of 0 to 8.

$R^{51}$ may further include a substituent T and, among these, a sulfanyl group (SH), a hydroxy group (OH), or an amino group ($NR^N_2$) is preferable.

Z represents an amino group (the number of carbon atoms is preferably in the range of 0 to 6 and more preferably in the range of 0 to 3), a sulfonic acid group, a phosphoric acid group, a carboxyl group, a hydroxy group, a sulfanyl group, an onium group (the number of carbon atoms is preferably in the range of 3 to 12), or an amine oxide group ($—NR^{N+}_2 O^-$).

In the present invention, an amino group, a sulfonic acid group, a phosphoric acid group, or a carboxyl group may form an acid ester (for example, an alkyl ester having 1 to 6 carbon atoms) unless otherwise noted in a case of a salt or an acid thereof.

Preferred examples of the compound having an onium group include a compound ($R^{51}$—$NR^{N+}_3.M^-$) having an ammonium group and a compound ($C_5R^N_5N^+$—$R^{51}.M^-$) having a pyridinium group. $R^N$ has the same definition as that described above. $M^-$ is an anion (for example, $OH^-$) which becomes a pair.

Specific examples of the compound having an onium group further include compounds represented by the following formulae.

(O-4)

(O-5)

In the formulae, $R^{O7}$ to $R^{O10}$ each independently represent an alkyl group having 1 to 24 carbon atoms, an alkenyl group having 2 to 24 carbon atoms, an alkynyl group having 2 to 24 carbon atoms, an aryl group having 6 to 14 carbon atoms, an aralkyl group having 7 to 14 carbon atoms, and a group represented by the following Formula (y). In this case, at least one of $R^{O7}$ to $R^{O10}$ has preferably 6 or more carbon atoms and more preferably 8 or more carbon atoms.

Y1-(Ry1-Y2)my-Ry2-* (y)

Y1 represents an alkyl group having 1 to 12 carbon atoms, an alkenyl group having 2 to 12 carbon atoms, an alkynyl group having 2 to 12 carbon atoms, an aralkyl group having 7 to 14 carbon atoms, an aryl group having 6 to 14 carbon atoms, a hydroxy group, or an alkoxy group having 1 to 4 carbon atoms. Y2 represents O, S, CO, or $NR^N$ ($R^N$ represents a hydrogen atom or an alkyl group having 1 to 6 carbon atoms). Ry1 and Ry2 each independently represent an alkylene group having 1 to 6 carbon atoms, an alkenylene group having 2 to 6 carbon atoms, an alkynylene group having 2 to 6 carbon atoms, an arylene group having 6 to 10 carbon atoms, or a combination of these. my represents an integer of 0 to 6. When my is 2 or greater, a plurality of Ry1's and Y2's may be different from each other. Ry1 and Ry2 may further include a substituent T. The symbol "*" indicates an atomic bond.

$R^{O11}$ represents a group which is the same as that for $R^{O7}$. The number of carbon atoms is preferably 6 or greater and more preferably 8 or greater. $R^{O12}$ represents a substituent T. mO represents an integer of 0 to 5.

M4− and M5− are counterions and examples thereof include a hydroxide ion.

When Formula (V) represents a carboxylic acid, it is preferable that $R^{51}$ represents an alkyl group. In this case, the number of carbon atoms is preferably in the range of 1 to 24, more preferably in the range of 3 to 20, still more preferably in the range of 6 to 18, and particularly preferably in the range of 8 to 16. The alkyl group may further include a substituent T and this is the same as those described above. When Formula (V) is a fatty acid, it is preferable that the number of carbon atoms is relatively large as described above. It is considered that this is because protection properties of germanium and the silicide layer are more effectively exhibited when appropriate hydrophobicity is imparted to the additive.

When a compound (organic onium) having an onium group is employed as an organic additive, it is preferable that halogen acid and a salt thereof, an oxidant (for example, nitric acid), and a sulfonic acid compound (for example, methanesulfonic acid) are used by being combined with each other. It is more preferable that the organic onium is organic ammonium. Specifically, the organic onium is preferably organic ammonium having 5 or more carbon atoms and more preferably organic ammonium having 8 or more carbon atoms. The upper limit of the number of the carbon atoms is substantively 35 or less.

It is considered that an organic cation acts in a system in the following manner although an assumption is included. In the etching solution of the present invention, it is understood that halogen ions and nitric acid ions mainly show an etching action of the metal layer (second layer). It is understood that a sulfonic acid compound plays a role of decreasing the solubility of germanium and suppressing the elution. For this reason, a substantial amount of a sulfonic acid compound is preferably used. In this manner, selectivity of the germanium-containing layer (first layer) and the metal layer (second layer) is increased, but it is not sufficient. In the present embodiment, when an organic cation is allowed to coexist in the layer, the organic cation is adsorbed on the surface of the germanium-containing layer and thus an effective anticorrosive surface is formed. In this manner, the selectivity of etching is markedly expressed along with the effect of suppressing dissolution of germanium done by the sulfonic acid compound. At this time, when the number of carbon atoms of the organic cation is increased (for example, 5 or more carbon atoms), the elution of germanium can be more markedly suppressed. From a viewpoint of such an action, a small amount of organic cation may be present in the system and, particularly preferably, the appropriate amount and the kind which may enhance a cooperative action with the sulfonic acid compound is selected.

Examples of the organic onium include a nitrogen-containing onium (quaternary ammonium or the like), a phosphorus-containing onium (quaternary phosphonium or the like), a sulfur-containing onium (for example, $SRy_3^+$: Ry represents an alkyl group having 1 to 6 carbon atoms). Among these, a nitrogen-containing onium (quaternary ammonium, pyridinium, pyrazolium, imidazolium, or the like) is preferable. It is preferable that the organic cation is quaternary ammonium from among those described above.

As the organic onium, an ion represented by the following Formula (Q-1) is exemplified.

In the formulae, $R^{Q1}$ to $R^{Q4}$ each independently represent an alkyl group having 1 to 35 carbon atoms, an alkenyl group having 2 to 35 carbon atoms, an alkynyl group having 2 to 35 carbon atoms, an aryl group having 6 to 14 carbon atoms, an aralkyl group having 7 to 15 carbon atoms, and a group represented by the following Formula (yq). In this case, the total number of carbon atoms of $R^{Q1}$ to $R^{Q4}$ is preferably 5 or more and more preferably 8 or more.

Y3-(Ry3-Y4)ny-Ry4-*  (yq)

Y3 represents an alkyl group having 1 to 12 carbon atoms, an alkenyl group having 2 to 12 carbon atoms, an alkynyl group having 2 to 12 carbon atoms, an aralkyl group having 7 to 14 carbon atoms, an aryl group having 6 to 14 carbon atoms, a hydroxyl group, a sulfanyl group, an alkoxy group having 1 to 4 carbon atoms, or a thioalkoxy group having 1 to 4 carbon atoms. Y4 represents O, S, CO, or $NR^N$ ($R^N$ has the same definition as that described above). Ry3 and Ry4 each independently represent an alkylene group having 1 to 6 carbon atoms, an alkenylene group having 2 to 6 carbon atoms, an alkynylene group having 2 to 6 carbon atoms, an arylene group having 6 to 10 carbon atoms, or a combination of these. ny represents an integer of 0 to 6. When ny is 2 or greater, a plurality of Ry3's and Y4's may be different from each other. Ry3 and Ry4 may further include a substituent T. The symbol "*" indicates an atomic bond.

It is preferable that the organic cation is at least one selected from a group consisting of an alkyl ammonium cation, an aryl ammonium cation, and an alkyl-aryl ammonium cation.

Specifically, tetraalkyl ammonium (the number of carbon atoms is preferably in the range of 5 to 35, more preferably in the range of 8 to 25, and particularly preferably in the range of 10 to 25) is preferable. At this time, an alkyl group may be substituted with an arbitrary substituent (for example, a hydroxyl group, an allyl group, or an aryl group) within a range not damaging the effects of the present invention. Further, the alkyl group may be linear, branched, or cyclic. Specific examples thereof include tetramethyl ammonium (TMA), tetraethyl ammonium (TEA), benzyl trimethyl ammonium, ethyl trimethyl ammonium, 2-hydroxy ethyl trimethyl ammonium, benzyl triethyl ammonium, hexadecyl trimethyl ammonium, tetrabutyl ammonium (TBA), tetrahexyl ammonium (THA), tetrapropyl ammonium (TPA), trimethyl benzyl ammonium, lauryl pyridinium, cetyl pyridinium, lauryl trimethyl ammonium, hexadecyl trimethyl ammonium, octadecyl trimethyl ammonium, dodecyl dimethyl ammonium, dilauryl dimethyl ammonium, distearyl dimethyl ammonium, dioleyl dimethyl ammonium, lauryl dimethyl benzyl ammonium, and cetyl trimethyl ammonium.

A supply source of the organic cation, which is not particularly limited, may be added as a salt with the halogen ion or a salt of a hydroxide ion.

It is preferable that the compound represented by Formula (V) is any one of compounds represented by the following Formulae (V-1) to (V-3). In the formulae, $Z^1$ and $Z^2$ represent a sulfonic acid group with a linking group L interposed therebetween. $R^{56}$ represents a substituent T and, among the examples described above, an alkyl group is preferable. $n^{51}$ and $n^{56}$ represent an integer of 0 to 5. $n^{53}$ represents an integer of 0 to 4. The maximum values of $n^{51}$, $n^{53}$, and $n^{56}$ are increased or decreased according to the number of $Z^1$ or $Z^2$ in the same ring. $n^{52}$ represents an integer of 1 to 6 and is preferably 1 or 2. n54 and $n^{55}$ each independently represent an integer of 0 to 4 and $n^{54}+n^{55}$ is 1 or greater. $n^{54}+n^{55}$ is preferably 1 or 2. $n^{57}$ and $n^{58}$ each independently represent an integer of 0 to 5 and $n^{57}+n^{58}$ is 1 or greater. $n^{57}+n^{58}$ is preferably 1 or 2. A plurality of $R^{56}$'s may be the same as or different from each other. A linking group L is preferably $L^1$, $L^2$, or a combination of these and more preferably $L^1$.

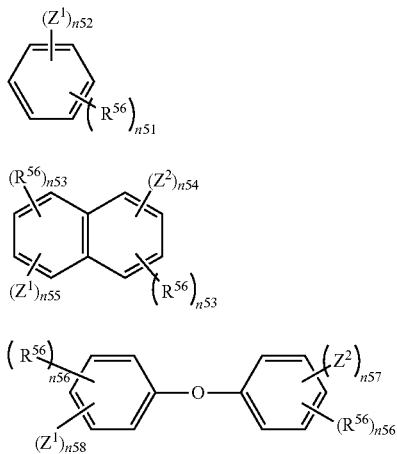

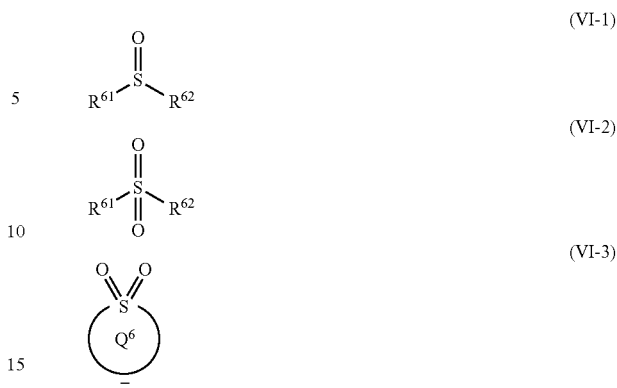

Formula (VI): $R^{61}$ and $R^{62}$ each independently represent an alkyl group (the number of carbon atoms is preferably in the range of 1 to 12, more preferably in the range of 1 to 6, and particularly preferably in the range of 1 to 3), an aryl group (the number of carbon atoms is preferably in the range of 6 to 22 and more preferably in the range of 6 to 14), an alkoxy group (the number of carbon atoms is preferably in the range of 1 to 12, more preferably in the range of 1 to 6, and particularly preferably in the range of 1 to 3), or an alkylamino group (the number of carbon atoms is preferably in the range of 1 to 12, more preferably in the range of 1 to 6, and particularly preferably in the range of 1 to 3). $R^{61}$ and $R^{62}$ may be bonded to each other or condensed to form a ring. When $R^{61}$ or $R^{62}$ represents an alkyl group, the alkyl group may be a group represented by *—$R^{52}$—($R^{53}$—$Y^{53}$)—$R^{54}$.

$L^2$ represents a carbonyl group, a sulfinyl group (SO), or a sulfonyl group (SO$_2$).

The compound represented by Formula (VI) is preferably a compound represented by any of the following Formulae (VI-1) to (VI-3). In the formulae, $R^{61}$ and $R^{62}$ have the same definitions as those described above. $Q^6$ is a 3- to 8-membered ring, preferably a 5- or 6-membered ring, more preferably a saturated 5- or 6-membered ring, and particularly preferably a 5- or 6-membered ring of saturated hydrocarbon. In this case, $Q^6$ may include an arbitrary substituent T.

Formula (VI): $R^{61}$ and $R^{62}$ each independently represent an alkyl group (the number of carbon atoms is preferably in the range of 1 to 12, more preferably in the range of 1 to 6, and particularly preferably in the range of 1 to 3), an aryl group (the number of carbon atoms is preferably in the range of 6 to 22 and more preferably in the range of 6 to 14), an alkoxy group (the number of carbon atoms is preferably in the range of 1 to 12, more preferably in the range of 1 to 6, and particularly preferably in the range of 1 to 3), or an alkylamino group (the number of carbon atoms is preferably in the range of 1 to 12, more preferably in the range of 1 to 6, and particularly preferably in the range of 1 to 3). $R^{61}$ and $R^{62}$ may be bonded to each other or condensed to form a ring. When $R^{61}$ or $R^{62}$ represents an alkyl group, the alkyl group may be a group represented by *—$R^{52}$—($R^{53}$—$Y^{53}$)—$R^{54}$.

$L^2$ represents a carbonyl group, a sulfinyl group (SO), or a sulfonyl group (SO$_2$).

Formula (VII): $R^{71}$ represents an amino group (—$NR^N{}_2$), or an ammonium group (—$NR^N{}_3{}^+$.M$^-$)

$L^3$ represents the same group as that for $L^1$. Among these, preferably, $L^3$ represents a methylene group, an ethylene group, a propylene group, or (-$L^{31}$(SR$^S$)p-). $L^{31}$ represents an alkylene group having 1 to 6 carbon atoms. R$^S$ may form a disulfide group at a hydrogen atom or at this site to be dimerized.

Formula (IIX): $R^{81}$ and $R^{82}$ each independently represent an alkyl group (the number of carbon atoms is preferably in the range of 1 to 12, more preferably in the range of 1 to 6, and particularly preferably in the range of 1 to 3), an alkenyl group (the number of carbon atoms is preferably in the range of 2 to 12 and more preferably in the range of 2 to 6), an alkynyl group (the number of carbon atoms is preferably in the range of 2 to 12 and more preferably in the range of 2 to 6), an aryl group (the number of carbon atoms is preferably in the range of 6 to 22 and more preferably in the range of 6 to 14), or an aralkyl group (the number of carbon atoms is preferably in the range of 7 to 23 and more preferably in the range of 7 to 15).

Formula (IX): $L^4$ represents the same group as that for $L^1$.

$R^{91}$ and $R^{93}$ each independently represent a hydrogen atom, an alkyl group (the number of carbon atoms is preferably in the range of 1 to 12, more preferably in the range of 1 to 6, and particularly preferably in the range of 1 to 3), an alkenyl group (the number of carbon atoms is preferably in the range of 2 to 12 and more preferably in the range of 2 to 6), an alkynyl group (the number of carbon atoms is preferably in the range of 2 to 12 and more preferably in the range of 2 to 6), an aryl group (the number of carbon atoms is preferably in the range of 6 to 22 and more preferably in the range of 6 to 14), an acyl group (the number of carbon atoms is preferably in the range of 2 to 12 and more preferably in the range of 2 to 6), or an aralkyl group (the number of carbon atoms is preferably in the range of 7 to 23 and more preferably in the range of 7 to 15). In this case, when n9 represents 0, both of $R^{91}$ and $R^{93}$ do not represent a hydrogen atom at the same time.

n9 represents an integer of 0 to 100, is preferably in the range of 0 to 50, more preferably in the range of 0 to 25, still more preferably in the range of 0 to 15, even still more preferably in the range of 0 to 10, and particularly preferably in the range of 0 to 5.

The compound represented by Formula (IX) is more preferably a compound represented by the following Formula (IX-1).

$$R^{91}-(OL^{41})-(OL^4)_{n91}-OR^{93} \quad (IX-1)$$

It is preferable that $L^{41}$ represents an alkylene group having 2 or more carbon atoms and the number of carbon atoms is preferably in the range of 2 to 6. Due to the setting of the carbon atoms of the alkylene group, it is assumed that a specific adsorption state with a metal (for example, Ti) is not formed and the removal thereof is not inhibited. Further, it is assumed that a binding component of a metal and a fluorine atom behaves in a hydrophilic or hydrophobic manner and a compound which connects oxygen atoms and has 2 or 3 or more carbon atoms suitably acts. From this viewpoint, the number of carbon atoms of $L^{41}$ is preferably 3 or greater, more preferably in the range of 3 to 6, and particularly preferably 3 or 4. Moreover, in regard to the number of carbon atoms of $L^{41}$, the carbon atoms included in a branch are excluded and the number of linked carbon atoms is preferably 2 or greater in a case of the alkylene group of a branch. For example, the number of linked carbon atoms in a 2,2-propanediyl group is 1. That is, the number of carbon atoms connecting O—O is referred to as the number of linked carbon atoms and a group having 2 or more linked carbon atoms is preferable. When an adsorption action with the above-described metals is considered, the number of linked carbon atoms is preferably 3 or greater, more preferably in the range of 3 to 6, and particularly preferably in the range of 3 to 4.

The number of linked carbon atoms of n91 is the same as that of n9.

When the present compound is a compound having two or more hydroxy groups of hydrogen atoms in $R^{91}$ and $R^{93}$, it is preferable that the structure thereof is represented by the following Formula (IX-2).

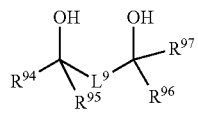

(IX-2)

$R^{94}$ to $R^{97}$ in the formula have the same definitions as those for $R^{91}$. $R^{94}$ to $R^{97}$ may further include a substituent T and, for example, may include a hydroxy group. $L^9$ represents an alkylene group, and the number of carbon atoms thereof is preferably in the range of 1 to 6 and more preferably in the range of 1 to 4. Specific examples of the compound represented by Formula (IX-2) include hexylene glycol, 1,3-butanediol, and 1,4-butanediol.

From a viewpoint of hydrophilicity and hydrophobicity, it is preferable that a compound whose CLogP value is in a desired range is used as the compound represented by Formula (IX). The CLogP value of the compound represented by Formula (IX) is preferably −0.4 or greater and more preferably −0.2 or greater. The upper limit thereof is preferably 2 or less and more preferably 1.5 or less.

ClogP

An octanol/water partition coefficient (log P value) can be normally measured using a flask immersion method described in JIS Japanese Industrial Standards Z7260-107 (2000). Further, the octanol/water partition coefficient (log P value) can be estimated by a calculating chemical method or an empirical method instead of actual measurement. It is known that a Crippen's fragmentation method (J. Chem. Inf. Comput. Sci., 27, 21 (1987)), a Viswanadhan's fragmentation method (J. Chem. Inf. Comput. Sci., 29, 163 (1989)), Broto's fragmentation method (Eur. J. Med. Chem. -Chim. Theor., 19, 71 (1984)), or the like is used as the calculation method thereof. In the present invention, the Crippen's fragmentation method (J. Chem. Inf. Comput. Sci., 27, 21 (1987)) is used.

The C log P value is obtained by calculating a common logarithm log P of a partition coefficient P to 1-octanol and water. A known method or known software can be used for calculating the C log P value, but, unless otherwise noted, a system from Daylight Chemical Information System, Inc. and a C log P program incorporated in PCModels are used in the present invention.

Formula (X): $R^{43}$ has the same definition as that for $R^N$. $R^{41}$ and $R^{42}$ each independently represent a hydrogen atom, an alkyl group (the number of carbon atoms is preferably in the range of 1 to 12, more preferably in the range of 1 to 6, and particularly preferably in the range of 1 to 3), an alkenyl group (the number of carbon atoms is preferably in the range of 2 to 12 and more preferably in the range of 2 to 6), an alkynyl group (the number of carbon atoms is preferably in the range of 2 to 12 and more preferably in the range of 2 to 6), an aryl group (the number of carbon atoms is preferably in the range of 6 to 22 and more preferably in the range of 6 to 14), an aralkyl group (the number of carbon atoms is preferably in the range of 7 to 23 and more preferably in the range of 7 to 15), a sulfanyl group, a hydroxy group, or an amino group. In this case, it is preferable that at least one of $R^{41}$ and $R^{42}$ is a sulfanyl group, a hydroxy group, or an amino group (the number of carbon atoms is preferably in the range of 0 to 6 and more preferably in the range of 0 to 3).

Formula (XI): $Y^7$ and $Y^8$ each independently represent an oxygen atom, a sulfur atom, an imino group ($NR^N$), or a carbonyl group. $R^{B1}$ represents a substituent (hereinafter, a substituent T is preferable). nB represents an integer of 0 to 8. However, any one of $Y^7$ and $Y^8$ may be a methylene group ($CR^C{}_2$).

Formula (XII): $Y^9$ and $Y^{10}$ each independently represent an oxygen atom, a sulfur atom, a methylene group ($CR^C{}_2$), an imino group ($NR^N$), or a carbonyl group. The positions of $Y^9$ and $Y^{10}$ may be different in a 6-membered ring.

$X^5$ and $X^6$ each independently represent a sulfur atom or an oxygen atom. The broken line means that the bond may be a single bond or a double bond. $R^{C1}$ represents a substituent (hereinafter, a substituent T is preferable). nC represents an integer of 0 to 2.

When a plurality of $R^{C1}$'s are present, the plurality of $R^{C1}$'s may be the same as or different from each other and may be bonded to each other or condensed to form a ring.

Formula (XIII): $X^3$ represents an oxygen atom, a sulfur atom, or an imino group ($NR^M$). $R^M$ represents a hydrogen atom or an alkyl group having 1 to 24 carbon atoms, and is preferably an alkyl group having 2 to 20 carbon atoms, more preferably an alkyl group having 4 to 16 carbon atoms, and particularly preferably an alkyl group having 6 to 12 carbon atoms.

$X^5$ represents an oxygen atom, a sulfur atom, an imino group ($NR^M$), or a methylene group ($CR^C_2$).

$R^{D1}$ represents a substituent and is preferably a substituent T described below. Among examples of $R^{D1}$, $R^{D1}$ is preferably an alkyl group having 1 to 24 carbon atoms and more preferably an alkyl group having 1 to 12 carbon atoms.

nD represents an integer of 0 to 6 and is preferably an integer of 0 to 2 and particularly preferably 1.

Among these, It is preferable that $X^3$—CO—$X^5$ in Formula is $NR^N$—CO—$CR^C_2$, O—CO—O or O—CO—$CR^C_2$.

It is particularly preferable that the specific organic additive is formed of a compound listed in Table A of Example described below. The concentration of the specific organic additive in the etching solution is preferably 0.005% by mass or greater, more preferably 0.01% by mass or greater, still more preferably 0.03% by mass or greater, and particularly preferably 0.05% by mass or greater. The upper limit thereof is preferably 10% by mass or less, more preferably 7% by mass or less, and particularly preferably 5% by mass or less.

It is preferable that the addition amount thereof is defined because damage of the germanium-containing layer (first layer) or the germanium silicide layer can be effectively suppressed while excellent etching properties of the metal layer (second layer) are maintained.

The definitions of the specific organic additive and the non-halogen acidic compound overlap each other in some cases, but may be distinguished from each other from a viewpoint of functional aspects. That is, the non-halogen acidic compound is mainly used as a component of accelerating etching and the specific organic additive is used as a component that plays a role of protecting a germanium layer. When the specific organic additive and the non-halogen acidic compound are distinguished from each other, both can be distinguished by prioritizing the definition of the non-halogen acidic compound and the specific organic additive is used for removing the compound.

Further, in the present invention, the specific organic additive may be used alone or in combination of two or more kinds thereof. The expression of the "combination of two or more kinds" includes not only a case in which two kinds of compounds, that is, a compound corresponding to Formula (I) and a compound corresponding to Formula (II) are combined to each other but also a case in which two compounds corresponding to Formula (I) are combined with each other (for example, two compounds in which at least one of atomic groups $R^{11}$, $R^{12}$, and $X^1$ is different from each other even though both of the compounds are represented by Formula (I)). In the case where two or more kinds are combined with each other, the combination ratio thereof is not particularly limited, but the total amount used thereof is preferably in the above-described range of concentration as the sum of two or more kinds of specific organic additives.

The display of compounds in the present specification (for example, when a compound is referred to by being added at the end of the compound) is used to include the compound itself, a salt thereof, and an ion thereof. Further, the display thereof includes a derivative which is partially changed by being esterified or introducing a substituent within a range in which desired effects can be exhibited.

A substituent (the same applies to a linking group) in which substitution or unsubstitution is not specified in the present specification means that an arbitrary substituent may be included in the group. The same applies to a compound in which substitution or unsubstitution is not specified. As a preferred substituent, the substituent T described below is exemplified.

Examples of the substituent T include the followings.

An alkyl group (preferably an alkyl group having 1 to 20 carbon atoms such as methyl, ethyl, isopropyl, t-butyl, pentyl, heptyl, 1-ethylpentyl, benzyl, 2-ethoxyethyl, or 1-carboxymethyl), an alkenyl group (preferably, an alkenyl group having 2 to 20 carbon atoms such as vinyl, allyl, or oleyl), an alkynyl group (preferably an alkynyl group having 2 to 20 carbon atoms such as ethynyl, butadiynyl, or phenylethynyl), a cycloalkyl group (preferably a cycloalkyl group having 3 to 20 carbon atoms such as cyclopropyl, cyclopentyl, cyclohexyl, or 4-methylcyclohexyl), an aryl group (preferably an aryl group having 6 to 26 carbon atoms such as phenyl, 1-naphthyl, 4-methoxyphenyl, 2-chlorophenyl, or 3-methylphenyl), a heterocyclic group (preferably a heterocyclic group having 2 to 20 carbon atoms or preferably a heterocycle of a 5- or 6-membered ring having at least one of an oxygen atom, a sulfur atom and a nitrogen atom such as 2-pyridyl, 4-pyridyl, 2-imidazolyl, 2-benzimidazolyl, 2-thiazolyl, or 2-oxazolyl), an alkoxy group (preferably an alkoxy group having 1 to 20 carbon atoms such as methoxy, ethoxy, isopropyloxy, or benzyloxy), an aryloxy group (preferably an aryloxy group having 6 to 26 carbon atoms such as phenoxy, 1-naphthyloxy, 3-methylphenoxy, or 4-methoxyphenoxy), an alkoxycarbonyl group (preferably an alkoxycarbonyl group having 2 to 20 carbon atoms such as ethoxycarbonyl or 2-ethylhexyloxycarbonyl), an amino group (preferably an amino group having 0 to 20 carbon atoms, an alkylamino group having 0 to 20 carbon atoms, or an arylamino group having 0 to 20 carbon atoms such as amino, N,N-dimethylamino, N,N-diethylamino, N-ethylamino, or anilino), a sulfamoyl group (preferably a sulfamoyl group having 0 to 20 carbon atoms such as N,N-dimethylsulfamoyl or N-phenylsulfamoyl), an acyl group (preferably an acyl group having 1 to 20 carbon atoms such as acetyl, propionyl, butyryl, or benzoyl), an acyloxy group (preferably an acyloxy group having 1 to 20 carbon atoms such as acetyloxy or benzoyloxy), a carbamoyl group (preferably a carbamoyl group having 1 to 20 carbon atoms such as N,N-dimethylcarbamoyl or N-phenylcarbamoyl), an acylamino group (preferably an acylamino group having 1 to 20 carbon atoms such as acetylamino or benzoylamino), a sulfonamide group (preferably a sulfamoyl group having 0 to 20 carbon atoms such as methanesulfonamide, benzenesulfonamide, N-methylmethanesulfonamide, or N-ethylbenzenesulfonamide), an alkylthio group (preferably an alkylthio group having 1 to 20 carbon atoms such as methylthio, ethylthio, isopropylthio, or benzylthio), an arylthio group (preferably an arylthio group having 6 to 26 carbon atoms such as phenylthio, 1-naphthylthio, 3-methylphenylthio, or 4-methoxyphenylthio), alkyl or an arylsulfonyl group (preferably alkyl or an arylsulfonyl group having 1 to 20 carbon atoms such as methylsulfonyl, ethylsulfonyl, or benzenesulfonyl), a hydroxyl group, a cyano group, and a halogen atom (such as a fluorine atom, a chlorine atom, a bromine atom, or an iodine atom). Among these, an alkyl group, an alkenyl group, an aryl group, a heterocyclic group, an alkoxy group, an aryloxy group, an alkoxycarbonyl group, an amino group, an acylamino group, a hydroxyl group or a halogen atom is more preferable. Further, an alkyl group, an alkenyl group, a heterocyclic group, an alkoxy group, an alkoxycarbonyl group, an amino group, an acylamino group, or a hydroxyl group is particularly preferable.

Moreover, respective groups exemplified in these substituents T may be further substituted with the above-described substituents T.

When a compound or a substituent and a linking group include an alkyl group/an alkylene group, an alkenyl group/an alkenylene group, or an alkynyl group/an alkynylene group, these may be cyclic, chain-like, linear, or branched and may be substituted or unsubstituted as described above. Moreover, when an aryl group and a heterocyclic group are included, these may be a single ring or a condensed ring and may be substituted or unsubstituted.

(Aqueous Medium)

In the embodiment, water (aqueous medium) may be used as a medium of the etching solution of the present invention. An aqueous medium containing dissolved components within a range not damaging the effects of the present invention may be used as water (aqueous medium) or water may contain a small amount of inevitable mixing components. Among these, water subjected to a purification treatment such as distilled water, ion-exchange water, or ultrapure water is preferable and ultrapure water to be used for manufacturing a semiconductor is particularly preferable.

(Kit)

The etching solution in the present invention may be used for a kit obtained by dividing the raw material of the etching solution into plural. For example, an aspect in which a liquid composition containing the above-described acidic compound in water as a first liquid is prepared and a liquid composition containing the above-described specific organic additive in an aqueous medium as a second liquid is prepared is exemplified. At this time, the components of another oxidant and the like can be separately contained or can be contained together in a first liquid, a second liquid, or another third liquid. The preferable aspect is a kit of the first liquid containing an acid compound and a specific organic compound and the second liquid containing an oxidant.

As the usage example, an aspect of preparing an etching solution by mixing both of the liquids and then using the etching solution for the etching treatment at a suitable time is preferable. In this manner, deterioration of liquid performance due to decomposition of respective components is not caused and a desired etching action can be effectively exhibited. Here, the term "suitable time" after mixing both of the liquids indicates a period during which a desired action is lost after the mixing, and, specifically, the period is preferably within 60 minutes, more preferably within 30 minutes, still more preferably within 10 minutes, and particularly preferably within 1 minute. The lower limit thereof, which is not particularly limited, is substantively 1 second or longer.

Figure 3:
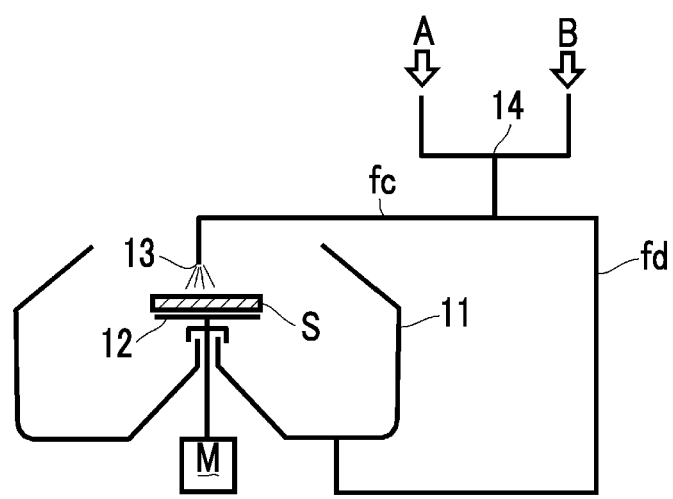
FIG. 3 is a configuration view of a device illustrating a part of a wet etching device according to a preferred embodiment of the present invention.

The manner of mixing the first liquid and the second liquid is not particularly limited, but the mixing is preferably performed by circulating the first liquid and the second liquid in different channels and merging both of the liquids at a junction point. Subsequently, both of the liquids are circulated through the channels, an etching solution obtained after both of the liquids are merged is ejected or sprayed from an ejection opening, and the etching solution is brought into contact with a semiconductor substrate. In the embodiment, it is preferable that the process from which both of the liquids are merged and mixed with each other at the junction point to which the solution is brought into contact with the semiconductor substrate is performed at a suitable time. When this process is described with reference to FIG. 3, the prepared etching solution is sprayed from an ejection opening 13 and then applied to the upper surface of a semiconductor substrate S in a treatment container (treatment tank) 11. In the embodiment shown in the same figure, two liquids of A and B are supplied to be merged with each other at a junction point 14 and then the liquids are transitioned to the ejection opening 13 through a channel fc. A channel fd indicates a returning path for reusing a liquid chemical. It is preferable that the semiconductor substrate S is on a rotary table 12 and rotates along with the rotary table by a rotation driving unit M. In addition, in the embodiment in which such a substrate rotation type device is used, the same applies to a treatment using the etching solution which is not used for a kit.

Moreover, in the etching solution of the present invention, it is preferable that the amount of impurities in the solution, for example, metal is small when the usage of the etching solution is considered. Particularly, the ion concentration of Na, K, and Ca in the solution is preferably in the range of 1 ppt to 1 ppm. Further, in the etching solution, the number of coarse particles having an average particle diameter of 0.5 µm or greater is preferably $100/cm^3$ or less.

(Container)

The etching solution of the present invention fills an arbitrary container to be stored, transported, and then used as long as corrosion resistance is not a problem (regardless of the container being a kit or not). Further, a container whose cleanliness is high and in which the amount of impurities to be eluted is small is preferable for the purpose of using the container for a semiconductor. As a usable container, "Clean bottle" series (manufactured by ACELLO CORPORATION) or "Pure bottle" (manufactured by KODAMA PLASTICS Co., Ltd.) is exemplified, but the examples are not limited thereto.

[Etching Conditions]

In an etching method of the present invention, it is preferable to use a sheet type device. Specifically, a sheet type device which has a treatment tack and in which the semiconductor substrate is transported or rotated in the treatment tank, the etching solution is provided (ejection, spray, falling, dropping, or the like) in the treatment tank, and the etching solution is brought into contact with the semiconductor substrate is preferable.

Advantages of the sheet type device are as follows: (i) a fresh etching solution is constantly supplied and thus reproducibility is excellent and (ii) in-plane uniformity is high. Further, a kit obtained by dividing the etching solution into plural is easily used and, for example, a method of mixing the first and second liquids are mixed with each other in line and ejecting the liquid in line is suitably employed. At this time, a method of mixing the liquids with each other and ejecting the mixed solution after the temperature of both of the first liquid and the second liquid is adjusted or the temperature of one of the first liquid and the second liquid is adjusted is preferable. Between the two, adjusting the temperature of both liquids is more preferable. It is preferable that the managed control at the time of adjusting the temperature of the line is set to be in the same range as that of the treatment temperature described below.

The sheet type device is preferably provided with a nozzle in the treatment tank thereof and a method of ejecting the etching solution to the semiconductor substrate by swinging the nozzle in the plane direction of the semiconductor substrate is preferable. In this manner, deterioration of the solution can be prevented, which is preferable. Further, the solution is divided into two or more liquids after the kit is prepared and thus gas or the like is unlikely to be generated, which is preferable.

The treatment temperature of performing etching in the method of measuring the temperature in Example described below is preferably 20° C. or higher and more preferably 30° C. or higher. The upper limit thereof is preferably 80° C. or lower, more preferably 70° C. or lower, and still more preferably 60° C. or lower. It is preferable that the temperature is set to be higher than or equal to the lower limit because the etching rate with respect to the second layer can be sufficiently secured. It is preferable that the temperature thereof is set to be lower than or equal to the upper limit thereof because stability over time for the rate of the etching treatment can be maintained. In addition, when the etching treatment is carried out at around room temperature, this leads to a reduction of energy consumption.

The rate of supplying the etching solution, which is not particularly limited, is preferably in the range of 0.05 L/min to 5 L/min and more preferably in the range of 0.1 L/min to 3 L/min. It is preferable that the rate thereof is set to be greater than or equal to the lower limit because the in-plane uniformity of etching can be more excellently secured. It is preferable that the rate thereof is set to be less than or equal to the upper limit because the performance stabilized at the time of performing a treatment continuously can be secured. The rotation of the semiconductor substrate also depends on the size thereof and the semiconductor substrate rotates preferably at 50 rpm to 1000 rpm from the same viewpoint described above.

In sheet type etching according to the preferred embodiment of the present invention, it is preferable that the semiconductor substrate is transported or rotated in a predetermined direction and an etching solution is brought into contact with the semiconductor substrate by spraying the etching solution to the space of the semiconductor substrate. The rate of supplying the etching solution and the rotation rate of the substrate are the same as those described above.

Figure 4:
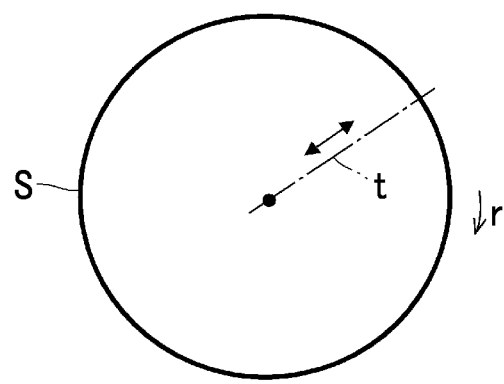
FIG. 4 is a plan view schematically illustrating a movement trajectory line of a nozzle with respect to a semiconductor substrate according to an embodiment of the present invention.

In the configuration of the sheet type device according to the preferred embodiment of the present invention, it is preferable that the etching solution is provided while the ejection opening (nozzle) is moved as illustrated in FIG. 4. Specifically, in the present embodiment, the substrate is rotated in an r direction when the etching solution is applied to the semiconductor substrate S. Further, the ejection opening is set to move along a movement locus line t extending to the end portion from the central portion of the semiconductor substrate. In this manner, the rotation direction of the substrate and the movement direction of the ejection opening are set to be different from each other in the present embodiment and thus both directions are set to be relatively moved. As a result, the etching solution can be evenly provided for the entire surface of the semiconductor substrate and the uniformity of etching is suitably secured.

The moving speed of the ejection opening (nozzle), varies depending on the kind of metal, but is preferably 0.1 cm/s or greater and more preferably 1 cm/s or greater. The upper limit thereof is preferably 30 cm/s or less and more preferably 15 cm/s or less. The movement locus line may be linear or curved (for example, ark-shaped). In both cases, the movement speed can be calculated from the distance of an actual locus line and the time spent for the movement thereof. The time required for etching one sheet of substrate is preferably in the range of 10 seconds to 180 seconds.

It is preferable that the metal layer is etched at a high etching rate. An etching rate [R2] of the second layer (metal layer), which is not particularly limited, is preferably 20 Å/min or greater, more preferably 100 Å/min or greater, and particularly preferably 200 Å/min or greater in terms of productivity. The upper limit, which is not particularly limited, is substantively 1200 Å/min or less.

The exposure width of the metal layer, which is not particularly limited, is preferably 2 nm or greater and more preferably 4 nm or greater from a viewpoint that the advantages of the present invention become remarkable. The upper limit thereof is substantively 1000 nm or less, preferably 100 nm or less, and more preferably 20 nm or less from a viewpoint that the effects thereof become significant in the same manner.

An etching rate [R1] of the germanium-containing layer (first layer) or the silicide layer is not particularly limited, but it is preferable that the layer is not excessively removed. The etching rate thereof is preferably 50 Å/min or less, more preferably 20 Å/min or less, and particularly preferably 10 Å/min or less. The lower limit thereof, which is not particularly limited, is substantively 0.1 Å/min or greater when the measurement limit is considered.

In the selective etching of the first layer, the ratio of the etching rate ([R2]/[R1]), which is not particularly limited, is preferably 2 or greater, more preferably 10 or greater, and still more preferably 20 or greater from a viewpoint of elements which need high selectivity. The upper limit thereof, which is not particularly limited, is preferred as the value becomes larger, but the upper limit thereof is substantively 5000 or less.

In the etching method of the present application, it is preferable that a metal layer, which is different from the first layer containing germanium (Ge), the second layer containing a specific metal element other than germanium (Ge), and the layer (third layer) being disposed between the first layer and the second layer and containing germanium (Ge) and the specific metal element, is disposed in the substrate and, especially, a metal layer containing any of Al, W, TiN, and Hf is disposed.

[Manufacture of Semiconductor Substrate Product]

In the present embodiment, it is preferable that a semiconductor substrate product having a desired structure is manufactured through a process of preparing a semiconductor substrate on which the silicon layer and the metal layer are formed on a silicon wafer, a process of annealing the semiconductor substrate, and a process of providing the etching solution for the semiconductor substrate such that the etching solution is brought into contact with the metal layer and selectively removing the metal layer. At this time, the specific etching solution is used for etching. The order of the processes is not limited and other processes may be further included between respective processes.

The size of a wafer is not particularly limited, but a wafer whose diameter is 8 inches, 12 inches, or 14 inches is preferably used.

EXAMPLES

Hereinafter, the present invention will be specifically described with reference to Examples, but the present invention is not limited to Examples described below.

(Preparation of Silicide-Processed Substrate)

SiGe was epitaxially grown on a commercially available silicon substrate (diameter: 12 inches) and a Pt/Ni metal layer (thickness: 20 nm, ratio of Pt/Ni: 10/90 (on a mass basis)) was subsequently formed. At this time, the SiGe epitaxial layer contained 50% by mass to 60% by mass of germanium. The semiconductor substrate was annealed at 800° C. for 10 seconds and a silicide layer was formed to be used as a test substrate. The thickness of the annealed silicide layer was 15 nm and the thickness of the metal layer was 5 nm. Further, a metal layer (thickness: 20 nm) serving as an electrode material was formed in each of the test substrates by CVD and used for the test. More specifically, Al, W, TiN, and Hf listed in Table 2 were laminated with each other in a position spaced from the center of the substrate by 6 cm to have dimensions of a thickness of 20 nm, a length of 1 cm, and a width of 1 cm as needed.

(Etching Test)

The etching was performed under the following conditions in a sheet type device (POLOS (trade name), manufactured by SPS-Europe B. V.) with respect to the substrate for a test and an evaluation test was carried out.

Treatment temperature: listed in Tables
Ejection amount: 1 L/min.
Wafer rotation speed: 500 rpm
Nozzle movement speed: listed in Tables Further, the etching solution was supplied using "one" liquid when the number of treatment liquids was one in Table 3 or "two" liquids in the same Table when the number of treatment liquids was two to be line mixed (see FIG. 3). A supply line fc was heated such that the temperature thereof was adjusted to 60° C.

First liquid (A): acid compound, specific compound, and water
Second liquid (B): oxidant and water The ratio of the first liquid to the second liquid was set such that the amounts thereof were substantially the same as each other in terms of the volume. According to the formulation, when an acid compound was singly used, a treatment using only one liquid was carried out in this case.

(Method of Measuring Treatment Temperature)

A radiation thermometer IT-550F (trade name, manufactured by HORIBA, Ltd.) was fixed to a position having a height of 30 cm on a wafer in the sheet type device. The thermometer was directed to the surface of the wafer outside from the center thereof by a distance of 2 cm and the temperature was measured while circulating a liquid chemical. The temperature was continuously recorded using a computer through digital output from the radiation thermometer. Among these, a value obtained by averaging the recorded values of the temperature for 10 seconds at the time when the temperature thereof was stabilized was set as a temperature on the wafer.

In the above-described conditions, after the treatment was performed, the etching depth (set as DO) of the center of the substrate and the etching depth (set as DE) of a position spaced apart from the center of the substrate by 30 mm were measured with respect to silicide metal of Table 2.

The in-plane uniformity was evaluated using the ranking of Table 4 by calculating the value of "|DE−DO|/DO×100."

In addition, the in-plane uniformity is not an issue when a desired layer can be entirely removed over time. However, in the manufacture of a semiconductor, a treatment is highly demanded to be carried out within a predetermined time at the time of a manufacturing process and thus it is desired that a desired metal layer can be uniformly removed in a short period of time. On the contrary, when it takes too much time for removal, damage may be caused, for example, to a portion (germanium silicide layer) which gradually dissolves, but is not intended to be dissolved. Accordingly, in terms of product quality, it is preferable that the etching treatment is carried out in a short period of time (for example, for 1 minute to 2 minutes) and uniform etching without causing an unmelted residue in a plane becomes important.

(Ge Concentration)

In the substrate of the first layer containing germanium (Ge), a depth direction of 0 nm to 30 nm was analyzed using etching ESCA (Quantera, manufactured by ULVAC-PHI, INC.) and the average value of the Ge concentration in the analysis results at 3 nm to 15 nm was set as the Ge concentration (% by mass).

(Measurement of Content of Particles)

The number of coarse particles having an average particle diameter of 0.5 μm or greater in the etching solution was confirmed by measuring the number of particles having measurement particle diameter of 0.5 μm or greater contained in the solution using a liquid particle sensor KS42A (manufactured by RION Co., Ltd.).

(Measurement of Concentration of Alkali Metal Ions)

The concentration of Na, K, and Ca ions were measured by ICPM-8500 (manufactured by Shimadzu Corporation) using an evaluation stock solution.

TABLE 1-1

| Liquid chemical No. | Acid *1 | Concentration *2 | Second component | Concentration *2 | Additive | Concentration *2 | Alkali concentration (ppb) *3 | Particle (number/cm³) | Remainder |
|---|---|---|---|---|---|---|---|---|---|
| A01 | $H_2SO_4$ | 20 | — | — | — | — | 100 | 1 | $H_2O$ |
| A02 | HNO3 | 20 | — | — | — | — | 100 | 1 | $H_2O$ |
| A03 | $H_3PO_4$ | 20 | — | — | — | — | 100 | 1 | $H_2O$ |
| A04 | Methanesulfonic acid | 20 | — | — | — | — | 100 | 1 | $H_2O$ |
| A05 | Formic acid | 20 | — | — | — | — | 100 | 1 | $H_2O$ |
| A06 | Acetic acid | 20 | — | — | — | — | 100 | 1 | $H_2O$ |
| A07 | Lactic acid | 20 | — | — | — | — | 100 | 1 | $H_2O$ |
| A08 | Tartaric acid | 20 | — | — | — | — | 100 | 1 | $H_2O$ |
| A09 | Citric acid | 20 | — | — | — | — | 100 | 1 | $H_2 0$ |
| A10 | Succinic acid | 20 | — | — | — | — | 100 | 1 | $H_2O$ |
| A11 | Oxalic acid | 20 | — | — | — | — | 100 | 1 | $H_2O$ |
| A12 | Phthalic acid | 20 | — | — | — | — | 100 | 1 | $H_2O$ |
| A13 | Malonic acid | 20 | — | — | — | — | 100 | 1 | $H_2O$ |
| A14 | Benzoic acid | 20 | — | — | — | — | 100 | 1 | $H_2o$ |
| A15 | Salicylic acid | 20 | — | — | — | — | 100 | 1 | $H_2O$ |
| A16 | Phosphonic acid | 70 | — | — | — | — | 100 | 1 | $H_2O$ |
| A17 | Maleic acid | 20 | — | — | — | — | 100 | 1 | $H_2O$ |
| A18 | Malic acid | 20 | — | — | — | — | 100 | 1 | $H_2O$ |
| A19 | Gluconic acid | 20 | — | — | — | — | 100 | 1 | $H_2O$ |
| A20 | Glycolic acid | 20 | — | — | — | — | 100 | 1 | $H_2O$ |
| A21 | Ethanesulfonic acid | 20 | — | — | — | — | 100 | 1 | $H_2o$ |
| A22 | Propionic acid | 20 | — | — | — | — | 100 | 1 | $H_2O$ |
| A23 | Diglycolic acid | 20 | — | — | — | — | 100 | 1 | $H_2O$ |

TABLE 1-1-continued

| Liquid chemical No. | Acid *1 | Concentration *2 | Second component | Concentration *2 | Additive | Concentration *2 | Alkali concentration (ppb) *3 | Particle (number/cm³) | Remainder |
|---|---|---|---|---|---|---|---|---|---|
| A24 | Butanesulfonic acid | 20 | — | — | — | — | 100 | 1 | $H_2O$ |
| A25 | Ethanedisulfonic acid | 20 | — | — | — | — | 100 | 1 | $H_2O$ |
| A26 | Naphthalenesulfonic acid | 20 | — | — | — | — | 100 | 1 | $H_2O$ |
| A27 | Methanedisulfonic acid | 20 | — | — | — | — | 100 | 1 | $H_2O$ |
| A28 | p-toluenesulfonic acid | 20 | — | — | — | — | 100 | 1 | $H_2O$ |
| A29 | Dodecylsulfonic acid | 20 | — | — | — | — | 100 | 1 | $H_2O$ |
| A30 | Phthalic hydroxamic acid | 20 | — | — | — | — | 100 | 1 | $H_2O$ |
| A31 | Benzylsulfonic acid | 20 | — | — | — | — | 100 | 1 | $H_2O$ |
| A32 | Ethylene dioxy diacetic acid | 20 | — | — | — | — | 100 | 1 | $H_2O$ |
| A33 | Salicylic hydroxamic acid | 20 | — | — | — | — | 100 | 1 | $H_2O$ |
| A34 | Cyclohexanesulfonic acid | 20 | — | — | — | — | 100 | 1 | $H_2O$ |
| A35 | Trifluoromethanesulfonic acid | 20 | — | — | — | — | 100 | 1 | $H_2O$ |
| A36 | 3,5-naphthalenedisulfonic acid | 20 | — | — | — | — | 100 | 1 | $H_2O$ |
| A37 | Perfluorobutanesulfonic acid | 20 | — | — | — | — | 100 | 1 | $H_2O$ |
| A38 | Hydroxyphenylmethanesulfonic acid | 20 | — | — | — | — | 100 | 1 | $H_2O$ |
| B01 | $H_2SO_4$ | 20 | $H_2O_2$ | 6 | — | — | 100 | 1 | $H_2O$ |
| B02 | $H_2SO_4$ | 50 | $H_2O_2$ | 6 | — | — | 100 | 1 | $H_2O$ |

TABLE 1-2

| Liquid chemical No. | Acid *1 | Concentration *2 | Second component | Concentration *2 | Additive | Concentration *2 | Alkali concentration (ppb) *3 | Particle (number/cm³) | Remainder |
|---|---|---|---|---|---|---|---|---|---|
| C01 | $H_2SO_4$ | 50 | $H_2O_2$ | 6 | MTZ | 0.1 | 100 | 1 | $H_2O$ |
| C02 | $H_2SO_4$ | 50 | $H_2O_2$ | 6 | AMTZ | 0.1 | 100 | 1 | $H_2O$ |
| C03 | $H_2SO_4$ | 50 | $H_2O_2$ | 6 | DATZ | 0.1 | 100 | 1 | $H_2O$ |
| C04 | $H_2SO_4$ | 50 | $H_2O_2$ | 6 | MTAZ | 0.1 | 100 | 1 | $H_2O$ |
| C05 | $H_2SO_4$ | 50 | $H_2O_2$ | 6 | DMTAZ | 0.1 | 100 | 1 | $H_2O$ |
| C06 | $H_2SO_4$ | 50 | $H_2O_2$ | 6 | TIU | 0.1 | 100 | 1 | $H_2O$ |
| C07 | $H_2SO_4$ | 50 | $H_2O_2$ | 6 | ADE | 0.1 | 100 | 1 | $H_2O$ |
| C08 | $H_2SO_4$ | 50 | $H_2O_2$ | 6 | MP | 0.1 | 100 | 1 | $H_2O$ |
| C09 | $H_2SO_4$ | 50 | $H_2O_2$ | 6 | DAP | 0.1 | 100 | 1 | $H_2O$ |
| C10 | $H_2SO_4$ | 50 | $H_2O_2$ | 6 | Mpy | 0.1 | 100 | 1 | $H_2O$ |
| C11 | $H_2SO_4$ | 50 | $H_2O_2$ | 6 | Hpy | 0.1 | 100 | 1 | $H_2O$ |
| C12 | $H_2SO_4$ | 50 | $H_2O_2$ | 6 | Apy | 0.1 | 100 | 1 | $H_2O$ |
| C13 | $H_2SO_4$ | 50 | $H_2O_2$ | 6 | DAPy | 0.1 | 100 | 1 | $H_2O$ |
| C14 | $H_2SO_4$ | 50 | $H_2O_2$ | 6 | DDT | 0.1 | 100 | 1 | $H_2O$ |
| C15 | $H_2SO_4$ | 50 | $H_2O_2$ | 6 | DT | 0.1 | 100 | 1 | $H_2O$ |
| C16 | $H_2SO_4$ | 50 | $H_2O_2$ | 6 | OT | 0.1 | 100 | 1 | $H_2O$ |
| C17 | $H_2SO_4$ | 50 | $H_2O_2$ | 6 | Cs | 0.1 | 100 | 1 | $H_2O$ |
| C18 | $H_2SO_4$ | 50 | $H_2O_2$ | 6 | ME | 0.1 | 100 | 1 | $H_2O$ |
| C19 | $H_2SO_4$ | 50 | $H_2O_2$ | 6 | MPA | 0.1 | 100 | 1 | $H_2O$ |
| C20 | $H_2SO_4$ | 50 | $H_2O_2$ | 6 | TS | 0.1 | 100 | 1 | $H_2O$ |
| C21 | $H_2SO_4$ | 50 | $H_2O_2$ | 6 | MBTz | 0.1 | 100 | 1 | $H_2O$ |
| C22 | $H_2SO_4$ | 50 | $H_2O_2$ | 6 | MBIz | 0.1 | 100 | 1 | $H_2O$ |
| C23 | $H_2SO_4$ | 50 | $H_2O_2$ | 6 | MC | 0.1 | 100 | 1 | $H_2O$ |
| C24 | $H_2SO_4$ | 50 | $H_2O_2$ | 6 | DSA | 0.1 | 100 | 1 | $H_2O$ |
| C25 | $H_2SO_4$ | 50 | $H_2O_2$ | 6 | POEL | 0.1 | 100 | 1 | $H_2O$ |
| C26 | $H_2SO_4$ | 50 | $H_2O_2$ | 6 | LSA | 0.1 | 100 | 1 | $H_2O$ |
| C27 | $H_2SO_4$ | 50 | $H_2O_2$ | 6 | ANSA | 0.1 | 100 | 1 | $H_2O$ |
| C28 | $H_2SO_4$ | 50 | $H_2O_2$ | 6 | DBNA | 0.1 | 100 | 1 | $H_2O$ |
| C29 | $H_2SO_4$ | 50 | $H_2O_2$ | 6 | ADPNA | 0.1 | 100 | 1 | $H_2O$ |
| C30 | $H_2SO_4$ | 50 | $H_2O_2$ | 6 | DDNA | 0.1 | 100 | 1 | $H_2O$ |
| C31 | $H_2SO_4$ | 50 | $H_2O_2$ | 6 | LPS | 0.1 | 100 | 1 | $H_2O$ |
| C32 | $H_2SO_4$ | 50 | $H_2O_2$ | 6 | LPz | 0.1 | 100 | 1 | $H_2O$ |
| C33 | $H_2SO_4$ | 50 | $H_2O_2$ | 6 | LTMA | 0.1 | 100 | 1 | $H_2O$ |
| C34 | $H_2SO_4$ | 50 | $H_2O_2$ | 6 | LDMAB | 0.1 | 100 | 1 | $H_2O$ |
| C35 | $H_2SO_4$ | 50 | $H_2O_2$ | 6 | LCHIB | 0.1 | 100 | 1 | $H_2O$ |
| C36 | $H_2SO_4$ | 50 | $H_2O_2$ | 6 | DMLAo | 0.1 | 100 | 1 | $H_2O$ |
| C37 | $H_2SO_4$ | 50 | $H_2O_2$ | 6 | DAPAc | 0.1 | 100 | 1 | $H_2O$ |
| C38 | $H_2SO_4$ | 50 | $H_2O_2$ | 6 | PPG | 0.1 | 100 | 1 | $H_2O$ |
| Z01 | NaOH (Comparative Example) | 20 | — | — | — | — | — | — | $H_2O$ |

TABLE 1-2-continued

| Liquid chemical No. | Acid *1 | Concentration *2 | Second component | Concentration *2 | Additive | Concentration *2 | Alkali concentration (ppb) *3 | Particle (number/cm³) | Remainder |
|---|---|---|---|---|---|---|---|---|---|
| Z02 | HCl (Comparative Example) | 20 | — | — | — | — | — | — | H₂O |

*1: Comparative Example shows those other than acids
*2: Concentration of blended components on a % by mass basis
*3: Total concentration of Na, K, and Ca ions in liquid chemical

TABLE 2

| Substrate No. | Diameter of wafer (inch) | Ge content ratio (%) of SiGe | Silicide metal | Al | W | TiN | Hf |
|---|---|---|---|---|---|---|---|
| Sub 01 | 12 | 40 | Ti | Present | Present | Present | Present |
| Sub 02 | 8 | 40 | Ti | Present | Present | Present | Present |
| Sub 03 | 12 | 60 | Ti | Present | Present | Present | Present |
| Sub 04 | 12 | 80 | Ti | Present | Present | Present | Present |
| Sub 05 | 12 | 100 | Ti | Present | Present | Present | Present |
| Sub 06 | 12 | 40 | Ti | Absent | Present | Present | Present |
| Sub 07 | 12 | 40 | Ti | Present | Absent | Present | Present |
| Sub 08 | 12 | 40 | Ti | Present | Present | Absent | Present |
| Sub 09 | 12 | 40 | Ti | Present | Present | Present | Absent |
| Sub 10 | 12 | 40 | Co | Present | Present | Present | Present |
| Sub 11 | 12 | 40 | Ni | Present | Present | Present | Present |
| Sub 12 | 12 | 40 | NiPt | Present | Present | Present | Present |
| Sub 13 | 12 | 0 | Ti | Present | Present | Present | Present |

TABLE 3

| Treatment condition | Treatment temperature (° C.) | Treatment time (second) | Swing speed (cm/s) | Number of treatment liquids | Rinse process after treatment | RTA treatment before treatment | RTA treatment after treatment |
|---|---|---|---|---|---|---|---|
| SWT 01 | 40 | 60 | 6 | 1 | 60 seconds with water | Present | Present |
| SWT 02 | 50 | 60 | 6 | 1 | 60 seconds with water | Present | Present |
| SWT 03 | 30 | 60 | 6 | 1 | 60 seconds with water | Present | Present |
| SWT 04 | 40 | 80 | 6 | 1 | 60 seconds with water | Present | Present |
| SWT 05 | 40 | 40 | 6 | 1 | 60 seconds with water | Present | Present |
| SWT 06 | 40 | 60 | 4 | 1 | 60 seconds with water | Present | Present |
| SWT 07 | 40 | 60 | 8 | 1 | 60 seconds with water | Present | Present |
| SWT 08 | 40 | 60 | 6 | 1 | Absent | Present | Present |
| SWT 09 | 40 | 60 | 6 | 1 | 60 seconds with water | Absent | Present |
| SWT 10 | 40 | 60 | 6 | 1 | 60 seconds with water | Present | Absent |
| SWT 11 | 40 | 60 | 6 | 2 | 60 seconds with water | Present | Present |

RTA treatment: RTA treatment conditions at 350° C. for 0.5 seconds (preferable conditions of RTA are in a temperature range of 300° C. to 450° C. and a time of within 1.0 second)

TABLE 4

| |DE − DO|/DO × 100 | Evaluation Comment | |
|---|---|---|
| Less than 1 | 7 | In-plane variation is not almost found and is in the highest level |
| 1 to less than 3 | 6 | In-plane variation is slightly found and is in a pretty good level |
| 3 to less than 5 | 5 | In-plane variation is in a good level |
| 5 to less than 7 | 4 | In-plane variation is found, but is not a problematic level |
| 7 to less than 10 | 3 | In-plane variation is found and is in a barely acceptable level |
| 10 to less than 15 | 2 | In-plane variation is significantly found and is not an acceptable level |
| 15 or greater | 1 | In-plane variation is severe and is in an unacceptable level |

TABLE 5-1

| Test | Liquid chemical No. | Substrate No. | Process | Evaluation rank |
|---|---|---|---|---|
| 101 | C01 | Sub 01 | SWT 01 | 5 |
| 102 | C01 | Sub 02 | SWT 01 | 4 |
| 103 | C01 | Sub 03 | SWT 01 | 6 |
| 104 | C01 | Sub 04 | SWT 01 | 6 |
| 105 | C01 | Sub 05 | SWT 01 | 7 |
| 106 | C01 | Sub 06 | SWT 01 | 4 |
| 107 | C01 | Sub 07 | SWT 01 | 4 |
| 108 | C01 | Sub 08 | SWT 01 | 4 |
| 109 | C01 | Sub 09 | SWT 01 | 4 |
| 110 | C01 | Sub 10 | SWT 01 | 4 |
| 111 | C01 | Sub 11 | SWT 01 | 4 |
| 112 | C01 | Sub 12 | SWT 01 | 4 |
| 201 | C01 | Sub 01 | SWT 02 | 4 |
| 202 | C01 | Sub 01 | SWT 03 | 4 |
| 203 | C01 | Sub 01 | SWT 04 | 4 |
| 204 | C01 | Sub 01 | SWT 05 | 4 |
| 205 | C01 | Sub 01 | SWT 06 | 4 |
| 206 | C01 | Sub 01 | SWT 07 | 4 |

TABLE 5-1-continued

| Test | Liquid chemical No. | Substrate No. | Process | Evaluation rank |
|------|---------------------|---------------|---------|-----------------|
| 207 | C01 | Sub 01 | SWT 08 | 4 |
| 208 | C01 | Sub 01 | SWT 09 | 4 |
| 209 | C01 | Sub 01 | SWT 10 | 4 |
| 301 | A01 | Sub 01 | SWT 01 | 4 |
| 302 | A02 | Sub 01 | SWT 01 | 4 |
| 303 | A03 | Sub 01 | SWT 01 | 4 |
| 304 | A04 | Sub 01 | SWT 01 | 4 |
| 305 | A05 | Sub 01 | SWT 01 | 4 |
| 306 | A06 | Sub 01 | SWT 01 | 4 |
| 307 | A07 | Sub 01 | SWT 01 | 4 |
| 308 | A08 | Sub 01 | SWT 01 | 4 |
| 309 | A09 | Sub 01 | SWT 01 | 4 |
| 310 | A10 | Sub 01 | SWT 01 | 4 |
| 311 | A11 | Sub 01 | SWT 01 | 4 |
| 312 | A12 | Sub 01 | SWT 01 | 4 |
| 313 | A13 | Sub 01 | SWT 01 | 4 |
| 314 | A14 | Sub 01 | SWT 01 | 4 |
| 315 | A15 | Sub 01 | SWT 01 | 4 |
| 316 | A16 | Sub 01 | SWT 01 | 4 |
| 317 | A17 | Sub 01 | SWT 01 | 4 |
| 318 | A18 | Sub 01 | SWT 01 | 4 |
| 319 | A19 | Sub 01 | SWT 01 | 4 |
| 320 | A20 | Sub 01 | SWT 01 | 4 |
| 321 | A21 | Sub 01 | SWT 01 | 4 |
| 322 | A22 | Sub 01 | SWT 01 | 4 |
| 323 | A23 | Sub 01 | SWT 01 | 4 |
| 324 | A24 | Sub 01 | SWT 01 | 4 |
| 325 | A25 | Sub 01 | SWT 01 | 4 |
| 326 | A26 | Sub 01 | SWT 01 | 4 |
| 327 | A27 | Sub 01 | SWT 01 | 4 |
| 328 | A28 | Sub 01 | SWT 01 | 4 |

TABLE 5-2

| Test | Liquid chemical No. | Substrate No. | Process | Evaluation rank |
|------|---------------------|---------------|---------|-----------------|
| 329 | A29 | Sub 01 | SWT 01 | 4 |
| 330 | A30 | Sub 01 | SWT 01 | 4 |
| 331 | A31 | Sub 01 | SWT 01 | 4 |
| 332 | A32 | Sub 01 | SWT 01 | 4 |
| 333 | A33 | Sub 01 | SWT 01 | 4 |
| 334 | A34 | Sub 01 | SWT 01 | 4 |
| 335 | A35 | Sub 01 | SWT 01 | 4 |
| 336 | A36 | Sub 01 | SWT 01 | 4 |
| 337 | A37 | Sub 01 | SWT 01 | 4 |

TABLE 5-2-continued

| Test | Liquid chemical No. | Substrate No. | Process | Evaluation rank |
|------|---------------------|---------------|---------|-----------------|
| 338 | A38 | Sub 01 | SWT 01 | 4 |
| 401 | B01 | Sub 01 | SWT 01 | 4 |
| 402 | B02 | Sub 01 | SWT 01 | 4 |
| 501 | C02 | Sub 01 | SWT 01 | 4 |
| 502 | C03 | Sub 01 | SWT 01 | 4 |
| 503 | C04 | Sub 01 | SWT 01 | 4 |
| 504 | C05 | Sub 01 | SWT 01 | 4 |
| 505 | C06 | Sub 01 | SWT 01 | 4 |
| 506 | C07 | Sub 01 | SWT 01 | 4 |
| 507 | C08 | Sub 01 | SWT 01 | 4 |
| 508 | C09 | Sub 01 | SWT 01 | 4 |
| 509 | C10 | Sub 01 | SWT 01 | 4 |
| 510 | C11 | Sub 01 | SWT 01 | 4 |
| 511 | C12 | Sub 01 | SWT 01 | 4 |
| 512 | C13 | Sub 01 | SWT 01 | 4 |
| 513 | C14 | Sub 01 | SWT 01 | 4 |
| 514 | C15 | Sub 01 | SWT 01 | 4 |
| 515 | C16 | Sub 01 | SWT 01 | 4 |
| 516 | C17 | Sub 01 | SWT 01 | 4 |
| 517 | C18 | Sub 01 | SWT 01 | 4 |
| 518 | C19 | Sub 01 | SWT 01 | 4 |
| 519 | C20 | Sub 01 | SWT 01 | 4 |
| 520 | C21 | Sub 01 | SWT 01 | 4 |
| 521 | C22 | Sub 01 | SWT 01 | 4 |
| 522 | C23 | Sub 01 | SWT 01 | 4 |
| 523 | C24 | Sub 01 | SWT 01 | 4 |
| 524 | C25 | Sub 01 | SWT 01 | 4 |
| 525 | C26 | Sub 01 | SWT 01 | 4 |
| 526 | C27 | Sub 01 | SWT 01 | 4 |
| 527 | C28 | Sub 01 | SWT 01 | 4 |
| 528 | C29 | Sub 01 | SWT 01 | 4 |
| 529 | C30 | Sub 01 | SWT 01 | 4 |
| 530 | C31 | Sub 01 | SWT 01 | 4 |
| 531 | C32 | Sub 01 | SWT 01 | 4 |
| 532 | C33 | Sub 01 | SWT 01 | 4 |
| 533 | C34 | Sub 01 | SWT 01 | 4 |
| 534 | C35 | Sub 01 | SWT 01 | 4 |
| 535 | C36 | Sub 01 | SWT 01 | 4 |
| 536 | C37 | Sub 01 | SWT 01 | 4 |
| 537 | C38 | Sub 01 | SWT 01 | 4 |
| 601 | C01 | Sub 01 | SWT 11 | 6 |
| Comp 01 | A01 | Sub 13 | SWT 01 | 1 |
| Comp 02 | Z01 | Sub 01 | SWT 01 | Impossible to evaluate |
| Comp 03 | Z02 | Sub 01 | SWT 01 | Impossible to evaluate |

In Comparative Example Comp 02, etching did not proceed and thus evaluation was not made.

TABLE A

| | | | |
|---|---|---|---|
| AMTAZ | 2-amino-5-mercapto-1,3,4-thiadiazole | Sulfolane | Sulfolane |
| MTZ | 3-mercapto-1,2,4-triazole | DMSO | Dimethyl sulfoxide |
| AMTZ | 3-amino-5-mercapto-1,2,4-triazole | XAN | Cyclohexanone |
| DATZ | 3,5-diamino-1,2,4-triazole | MEK | Methyl ethyl ketone |
| MTAZ | 2-mercapto-1,3,4-thiadiazole | DEGDM | Diethylene glycol dimethyl ether |
| DMTAZ | 2,5-dimercapto-1,3,4-thiadiazole | DEGDE | Diethylene glycol diethyl ether |
| TIU | Thiouracil | ACE | Ethyl acetate |
| ADE | Adenine | MPM | Methyl 3-methoxypropionate |
| MP | 6-methoxypurine | γ-BL | γ butyrolactone |
| DAP | 2,6-diaminopurine | NMP | N-methylpyrrolidone |
| Mpy | 2-mercaptopyridine | DMAA | NN-dimethylacelamide |
| Hpy | 2-hydroxypyridine | DIO | 1,4-dioxane |
| Apy | 2-aminopyridine | EC | Ethylene carbonate |
| DAPy | 2,6-diaminopyridine | PC | Propylene carbonate |
| DDT | 1-dodecanethiol | MSA | Methanesulfonic acid |
| DT | 1-decanethiol | PPG | Polypropylene glycol |
| OT | 1-octanethiol | | |
| Cs | Cystine | | |
| CsT | Cysteine | | |
| ME | Mercaptoethanol | | |
| MPA | 3-mercaptopropionic acid | | |
| TS | Thiosalicylic acid | | |
| MBTz | 2-mercaptobenzothiazole | | |
| MBIz | 2-mercaptobenzoimidazole | | |

TABLE A-continued

| | |
|---|---|
| MC | Mercaptosuccinic acid |
| DSA | Dodecylbenzenesulfonic acid |
| POEL | Polyoxyethylene lauryl ether sulfate |
| LSA | Lauryl sulfoacetate |
| ANSA | Alkyl naphthalene sulfonic acid |
| DBNA | Dibutyl naphthalene sulfonic acid |
| ADPNA | Alkyl diphenyl ether sulfonic acid |
| DDNA | Dodecyl naphthalene sulfonic acid |
| LPS | Lauryl phosphoric acid |
| LPz | Lauryl pyridinium chloride |
| LTMA | Lauryl trimethyl ammonium |
| LDMAB | Lauryl dimethyl aminoacetic acid betaine |
| LCHIB | 2-lauryl-N-carboxylmethyl-N-hydroxyethylimidazolinium betaine |
| DMLAo | Dimethyl laurylamine oxide |
| DAPAc | 3-dodecylaminopropionic acid |

The alkyl groups of ANSA and ADPNA respectively represent an isopropyl group and a dodecyl group.

The number of carbon atoms of polypropylene glycol is in the range of 6 to 100.

According to the present invention, it is understood that the second layer containing a specific metal can be selectively removed with respect to the first layer containing germanium and in-plane uniformity is excellent.

In addition, the thickness of a surface oxide film was measured immediately after the treatment was subjected to a substrate which was tested as described above, the substrate was allowed to stand still in the air at room temperature (25° C.) for three days, and then the thickness of the surface oxide film was measured again. As a result, the thickness of the substrate was not almost changed and the results were excellent.

EXPLANATION OF REFERENCES

1: metal layer (second layer)
2: silicon layer (first layer)
3: germanium silicide layer (third layer)
11: treatment container (treatment tank)
12: rotary table
13: ejection opening
14: junction point
S: substrate
21: silicon substrate
22: gate insulating film
23: gate electrode
25: side wall
26: source electrode
27: drain electrode
28: NiPt film
90A, 90B: replacement gate stack
92A, 92B: well
94A, 94B: source/drain extension region
96A, 96B: source/drain region
91A, 91B: metal semiconductor alloy portion
95A, 95B: gate spacer
97A, 97B: gate insulting film
81: first work function material layer
82A, 82B: second work function material layer
83A, 83B: metal portion
93: trench structure portion
99: flattened dielectric layer The present invention has been described with reference to the embodiments, but the detailed description of the invention is not intended to limit the invention unless otherwise noted and the present invention should be broadly interpreted without departing from the spirit and the scope described in the aspects of the invention.

What is claimed is:

1. An etching method of a semiconductor substrate that includes a first layer containing germanium (Ge), a second layer containing at least one specific metal element selected from nickel platinum (NiPt), titanium (Ti), nickel (Ni), and cobalt (Co), and a third layer containing a silicide comprised of germanium (Ge) and the specific metal element, which is interposed between the first layer and the second layer, the method comprising:
   bringing an etching solution which contains a non-halogen acidic compound into contact with the second layer and selectively removing the second layer with respect to the first layer and the third layer,
   wherein the concentration of germanium (Ge) of the first layer is from 40% by mass to less than 100% by mass,
   wherein the second layer completely covers the third layer,
   wherein the acidic compound is an inorganic acid which is selected from the group consisting of a phosphoric acid and a phosphonic acid, or an organic acid which contains a sulfonic acid group, a carboxyl group, a phosphoric acid group, a phosphonic acid group, or a hydroxamic acid group, and
   wherein said etching liquid contains no oxidant, or contains nitric acid or hydrogen peroxide as the oxidant in the concentration of 0.1% by mass or greater and 20.0% by mass or less.

2. The etching method according to claim 1, wherein the content of the acidic compound is in the range of 0.1% by mass to 90% by mass.

3. The etching method according to claim 1, further comprising:
   applying a heat treatment to at least one of the first layer and the second layer before or after etching with the etching solution.

4. The etching method according to claim 1, further comprising:
   allowing the semiconductor substrate to rotate and supplying the etching solution through a nozzle from the upper surface of the semiconductor substrate during rotation when the etching solution is provided for the semiconductor substrate.

5. The etching method according to claim 4, further comprising:
   providing the etching solution while the nozzle relatively moves with respect to rotation of the semiconductor substrate.

6. The etching method according to claim 1, wherein the temperature of the etching solution at the time of being brought into contact with the second layer is in the range of 15° C. to 80° C.

7. The etching method according to claim 1, wherein the time required for etching one substrate is in the range of 10 seconds to 180 seconds.

8. The etching method according to claim 1, further comprising:
a step of washing the semiconductor substrate with water at least before or after the etching.

9. The etching method according to claim 1,
wherein the etching solution further contains an oxidant, and
a first liquid which does not contain the oxidant and a second liquid which contains the oxidant are divided from each other and then stored.

10. The etching method according to claim 9, wherein the first liquid and the second liquid are mixed with each other at a suitable time when the semiconductor substrate is etched.

11. The etching method according to claim 1, wherein the etching solution further contains an organic additive formed of an organic compound which contains a nitrogen atom, a sulfur atom, a phosphorous atom, or an oxygen atom.

12. The etching method according to claim 1, wherein said etching solution contains no oxidant, or contains nitric acid or hydrogen peroxide as the oxidant in the concentration of 0.1% by mass or greater and 10.0% by mass or less.

13. The etching method according to claim 1, wherein the concentration of the acidic compound in the etching solution is 0.1% by mass or greater and 60.0% by mass or less.

14. An etching solution of a semiconductor substrate that includes a first layer containing germanium (Ge), a second layer containing a specific metal element other than germanium (Ge), and a third layer containing a silicide comprised of germanium (Ge) and the specific metal element, which is interposed between the first layer and the second layer, the etching solution selectively removing the second layer and comprising a non-halogen acidic compound,
wherein the concentration of germanium (Ge) of the first layer is from 40% by mass to less than 100% by mass,
wherein the second layer completely covers the third layer,
wherein the acidic compound is an inorganic acid which is selected from the group consisting of a phosphoric acid and a phosphonic acid, or an organic acid which contains a sulfonic acid group, a carboxyl group, a phosphoric acid group, a phosphonic acid group, or a hydroxamic acid group, and
wherein said etching liquid contains no oxidant, or contains nitric acid or hydrogen peroxide as the oxidant in the concentration of 0.1% by mass or greater and 20.0% by mass or less.

15. The etching solution according to claim 14, wherein the specific metal element constituting the second layer is selected from nickel platinum (NiPt), titanium (Ti), nickel (Ni), and cobalt (Co).

16. The etching solution according to claim 14, wherein the content of the acidic compound is in the range of 0.1% by mass to 90% by mass.

17. The etching solution according to claim 14, further comprising an organic additive formed of an organic compound which contains a nitrogen atom, a sulfur atom, a phosphorous atom, or an oxygen atom.

18. The etching solution according to claim 14, wherein said etching solution contains no oxidant, or contains nitric acid or hydrogen peroxide as the oxidant in the concentration of 0.1% by mass or greater and 10.0% by mass or less.

19. The etching method according to claim 14, wherein the concentration of the acidic compound in the etching solution is 0.1% by mass or greater and 60.0% by mass or less.

20. A production method for a semiconductor substrate product that includes a first layer containing germanium (Ge), comprising:
a step of forming at least the first layer and at least one kind of second layer selected from nickel platinum (NiPt), titanium (Ti), nickel (Ni), and cobalt (Co) on the semiconductor substrate;
a step of forming a third layer containing a silicide comprised of components of the first layer and the second layer between both layers by heating the semiconductor substrate;
a step of preparing an etching solution containing a non-halogen acidic compound; and
a step of bringing the etching solution into contact with the second layer and selectively removing the second layer with respect to the first layer and the third layer,
wherein the concentration of germanium (Ge) of the first layer is from 40% by mass to less than 100% by mass,
wherein the second layer completely covers the third layer,
wherein the non-halogen acidic compound is an inorganic acid which is selected from the group consisting of a phosphoric acid and a phosphonic acid, or an organic acid which contains a sulfonic acid group, a carboxyl group, a phosphoric acid group, a phosphonic acid group, or a hydroxamic acid group, and
wherein said etching liquid contains no oxidant, or contains nitric acid or hydrogen peroxide as the oxidant in the concentration of 0.1% by mass or greater and 20.0% by mass or less.

21. The etching method according to claim 1, wherein the concentration of germanium (Ge) of the first layer is from 40% by mass to 90% by mass.

22. The etching method according to claim 20, wherein said etching solution contains no oxidant, or contains nitric acid or hydrogen peroxide as the oxidant in the concentration of 0.1% by mass or greater and 10.0% by mass or less.

23. The etching method according to claim 20, wherein the concentration of the acidic compound in the etching solution is 0.1% by mass or greater and 60.0% by mass or less.

24. An etching method of a semiconductor substrate that includes a first layer containing germanium (Ge), a second layer containing at least one specific metal element selected from nickel platinum (NiPt), titanium (Ti), nickel (Ni), and cobalt (Co), and a third layer containing a silicide comprised of germanium (Ge) and the specific metal element, which is interposed between the first layer and the second layer, the method comprising:
bringing an etching solution which contains a non-halogen acidic compound into contact with the second layer and selectively removing the second layer with respect to the first layer and the third layer,
wherein the concentration of germanium (Ge) of the first layer is from 40% by mass to less than 100% by mass,
wherein the second layer completely covers the third layer,
wherein the composition of the third layer is represented by the formula $Si_xGe_yM_z$, wherein M represents a metal element selected from the group consisting of nickel platinum (NiPt), titanium (Ti), nickel (Ni), and cobalt (Co), and wherein, in the formula, x+y is in a range of 0.2 to 0.8 and z is in a range of 0.2 to 0.8, provided that x+y+z is 1.

25. An etching solution of a semiconductor substrate that includes a first layer containing germanium (Ge), a second layer containing a specific metal element other than germanium (Ge), and a third layer containing a silicide comprised of germanium (Ge) and the specific metal element, which is interposed between the first layer and the second layer, the etching solution selectively removing the second layer and comprising a non-halogen acidic compound, wherein the concentration of germanium (Ge) of the first layer is from 40% by mass to less than 100% by mass, wherein the second layer completely covers the third layer, wherein the composition of the third layer is represented by the formula $Si_xGe_yM_z$, wherein M represents a metal element selected from the group consisting of nickel platinum (NiPt), titanium (Ti), nickel (Ni), and cobalt (Co), and wherein, in the formula, x+y is in a range of 0.2 to 0.8 and z is in a range of 0.2 to 0.8, provided that x+y+z is 1.

26. A production method for a semiconductor substrate product that includes a first layer containing germanium (Ge), comprising:

a step of forming at least the first layer and at least one kind of second layer selected from nickel platinum (NiPt), titanium (Ti), nickel (Ni), and cobalt (Co) on the semiconductor substrate;

a step of forming a third layer containing a silicide comprised of components of the first layer and the second layer between both layers by heating the semiconductor substrate;

a step of preparing an etching solution containing an acidic compound; and a step of bringing the etching solution into contact with the second layer and selectively removing the second layer with respect to the first layer and the third layer, wherein the concentration of germanium (Ge) of the first layer is from 40% by mass to less than 100% by mass, wherein the second layer completely covers the third layer, wherein the composition of the third layer is represented by the formula $Si_xGe_yM_z$, wherein M represents a metal element selected from the group consisting of nickel platinum (NiPt), titanium (Ti), nickel (Ni), and cobalt (Co), and wherein, in the formula, x+y is in a range of 0.2 to 0.8 and z is in a range of 0.2 to 0.8, provided that x+y+z is 1.

* * * * *